United States Patent
Haneda

(10) Patent No.: US 9,954,545 B2
(45) Date of Patent: Apr. 24, 2018

(54) CIRCUIT DEVICE, PHYSICAL QUANTITY DETECTION DEVICE, ELECTRONIC APPARATUS, AND VEHICLE

(71) Applicant: Seiko Epson Corporation, Tokyo (JP)

(72) Inventor: Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/637,073

(22) Filed: Jun. 29, 2017

(65) Prior Publication Data

US 2018/0013441 A1   Jan. 11, 2018

(30) Foreign Application Priority Data

Jul. 6, 2016 (JP) .................................. 2016-133925

(51) Int. Cl.
| | | |
|---|---|---|
| H03M 1/66 | (2006.01) | |
| H03M 1/06 | (2006.01) | |
| H03M 1/46 | (2006.01) | |
| H03M 1/80 | (2006.01) | |

(52) U.S. Cl.
CPC ............. *H03M 1/069* (2013.01); *H03M 1/06* (2013.01); *H03M 1/0697* (2013.01); *H03M 1/46* (2013.01); *H03M 1/804* (2013.01)

(58) Field of Classification Search
CPC .... H03M 1/069; H03M 1/0697; H03M 1/804; H03M 1/46; H03M 1/06; H03M 1/66; H03M 1/747
USPC ......................................... 341/110, 118, 144
See application file for complete search history.

(56) References Cited

U.S. PATENT DOCUMENTS

| | | | | | |
|---|---|---|---|---|---|
| 5,932,861 | A | * | 8/1999 | Iwaguchi | ........... G06K 7/10584 235/455 |
| 7,816,936 | B2 | * | 10/2010 | Ito | ....................... G01R 31/2621 324/750.3 |
| 7,994,842 | B2 | * | 8/2011 | Ito | ..................... H03K 19/00384 327/534 |
| 2005/0231292 | A1 | * | 10/2005 | Akahori | ................. H03B 28/00 331/16 |
| 2007/0045755 | A1 | * | 3/2007 | Wen | .................... G01C 19/5783 257/414 |
| 2010/0283645 | A1 | | 11/2010 | Haneda | |

(Continued)

FOREIGN PATENT DOCUMENTS

| | | |
|---|---|---|
| JP | 2006-108893 A | 4/2006 |
| JP | 2006-140819 A | 6/2006 |

(Continued)

*Primary Examiner* — Jean B Jeanglaude
(74) *Attorney, Agent, or Firm* — Harness, Dickey & Pierce, P.L.C.

(57) ABSTRACT

A circuit device includes a control circuit having a successive approximation register, a D/A conversion circuit adapted to perform D/A conversion on output data from the successive approximation register, and a comparison circuit adapted to compare an analog input signal and an output signal from the D/A conversion circuit with each other, the control circuit includes an upper limit value register and a lower limit value register adapted to respectively hold an upper limit value and a lower limit value of a conversion range, and increases the upper limit value or decreases the lower limit value in the case in which the same comparison result has been output by the comparison circuit a predetermined number of times or more.

20 Claims, 18 Drawing Sheets

(56) References Cited

U.S. PATENT DOCUMENTS

| | | | |
|---|---|---|---|
| 2012/0112938 A1 | 5/2012 | Haneda | |
| 2012/0182166 A1* | 7/2012 | Haneda | H03M 1/1061 341/118 |
| 2012/0212357 A1* | 8/2012 | Haneda | H03M 1/066 341/110 |
| 2013/0265181 A1* | 10/2013 | Haneda | H03M 1/12 341/110 |
| 2015/0280730 A1 | 10/2015 | Tanaka et al. | |

FOREIGN PATENT DOCUMENTS

| | | |
|---|---|---|
| JP | 2010-263399 A | 11/2010 |
| JP | 2012-104938 A | 5/2012 |
| JP | 2013-192273 A | 9/2013 |
| JP | 2013-211611 A | 10/2013 |
| JP | 2014-200116 A | 10/2014 |
| JP | 2015-186137 A | 10/2015 |

\* cited by examiner

US 9,954,545 B2

CIRCUIT DEVICE, PHYSICAL QUANTITY DETECTION DEVICE, ELECTRONIC APPARATUS, AND VEHICLE

BACKGROUND

1. Technical Field

The present invention relates to a circuit device, a physical quantity detection device, an electronic apparatus, a vehicle, and so on.

2. Related Art

In the past, as an A/D conversion circuit for converting an analog signal into digital data, there has been known a successive approximation type A/D conversion circuit. The successive approximation type A/D conversion circuit is provided with a comparison circuit, a successive approximation register, and a D/A conversion circuit, and performs A/D conversion on the signal, which is obtained by performing a sample and hold operation on an input signal, by the successive approximation action to thereby output the digital data.

In the case in which a general method of determining the bit data bit by bit from the MSB side is used in the successive approximation type A/D conversion circuit for converting the input signal into n-bit digital data, the number of the conversion cycles is n. Since the number of the cycles affects the power consumption and a conversion speed, there has been proposed a method of reducing the number of the conversion cycles to thereby realize a high-speed A/D conversion with low power consumption.

In, for example, JP-A-2006-140819 (Document 1), there is disclosed a successive approximation A/D conversion circuit, which limits the conversion range for each analog signal to thereby achieve speeding-up. In JP-A-2006-108893 (Document 2), there is disclosed a successive approximation A/D conversion circuit, which uses the higher bits of the previous conversion code and performs the conversion of only the lower bits to thereby achieve speeding-up. In JP-A-2013-211611 (Document 3), there is disclosed an A/D conversion circuit, which limits the data range, in which the successive approximation is performed, when performing a pseudo oversampling operation to thereby achieve speeding-up.

Either of Document 1 through Document 3 limits the conversion range to reduce the conversion cycles to thereby achieve speeding-up. However, there is a problem that in the case in which a signal significantly deviating from the supposition is input, the digital data corresponding to the input signal becomes out of the conversion range, and the input signal cannot appropriately be converted.

SUMMARY

An advantage of some aspects of the invention is to provide a circuit device, a physical quantity detection device, an electronic apparatus, a vehicle, and so on for achieving speeding-up of the A/D conversion and suppression of the conversion error.

The invention can be implemented as the following configurations or aspects.

An aspect of the invention relates to a circuit device adapted to perform A/D conversion on an analog input signal, including a control circuit having a successive approximation register adapted to hold successive approximation data, a D/A conversion circuit adapted to perform D/A conversion on output data from the successive approximation register, and a comparison circuit adapted to perform a comparison process between the analog input signal and an output signal from the D/A conversion circuit, wherein the control circuit includes an upper limit value register adapted to hold an upper limit value of a conversion range of A/D conversion result data obtained by the A/D conversion of the analog input signal, and a lower limit value register adapted to hold a lower limit value of the conversion range, and performs at least one of an update of increasing the upper limit value and an update of decreasing the lower limit value in a case in which the comparison circuit has output a same comparison result a predetermined number of times or more in a successive approximation process.

In the aspect of the invention, in the circuit device as a successive approximation type A/D conversion circuit, in the case in which the same comparison result has been output from the comparison circuit a predetermined number of times or more at least one of increasing of the upper limit value of the conversion range and decreasing of the lower limit value thereof is performed. According to this configuration, it becomes possible to newly include the range, which has not been included in the conversion range before the update, in the conversion range. In other words, it becomes possible to set the conversion range to thereby achieve speeding-up of the conversion, and at the same time output an error-free conversion result by appropriately updating the conversion range.

In the aspect of the invention, in a case in which the comparison circuit has output a same comparison result the predetermined number of times or more from a first comparison in a successive approximation process, the control circuit may perform at least one of the update of increasing the upper limit value and the update of decreasing the lower limit value.

With this aspect configuration, since it is possible to use the fact that the same comparison result is output from the first comparison in the successive approximation process as the criterion for the increase of the upper limit and the decrease of the lower limit, it is possible to prevent the conversion range from being excessively extended.

In the aspect of the invention, the control circuit may perform an update of increasing the upper limit value in a case in which a comparison result that a voltage level of the analog input signal is equal to or higher than a voltage level of the output signal from the D/A conversion circuit has been output by the comparison circuit the predetermined number of times or more, and perform an update of decreasing the lower limit value in a case in which a comparison result that the voltage level of the analog input signal is lower than the voltage level of the output signal from the D/A conversion circuit has been output by the comparison circuit the predetermined number of times or more.

With this configuration, it becomes possible to update the upper limit value or the lower limit value in accordance with the comparison result.

In the aspect of the invention, the control circuit may update the upper limit value with an upper limit of a full scale of the successive approximation data in a case in which the upper limit value has reached the upper limit of the full scale, and update the lower limit value with a lower limit of the full scale of the successive approximation data in a case in which the lower limit value has reached the lower limit of the full scale.

With this configuration, since the upper limit and the lower limit of the full scale are considered, it is possible to prevent the conversion range from being excessively extended.

In the aspect of the invention, the control circuit may perform a redundancy range addition process of updating the lower limit value with a value between the lower limit value before the update and the successive approximation data in a case in which a comparison result that a voltage level of the analog input signal is equal to or higher than a voltage level of the output signal from the D/A conversion circuit has been output by the comparison circuit, and updating the upper limit value with a value between the upper limit value before the update and the successive approximation data in a case in which a comparison result that the voltage level of the analog input signal is lower than the voltage level of the output signal from the D/A conversion circuit has been output by the comparison circuit.

With this configuration, it is possible to add the redundancy range when updating the upper limit value or the lower limit value, and even in the case in which an error exists in the comparison result, it becomes possible to achieve appropriate conversion.

In the aspect of the invention, the control circuit may skip the redundancy range addition process in a case in which a same comparison result has been output by the comparison circuit the predetermined number of times or more in the successive approximation process.

With this configuration, since the redundancy range addition process can be skipped in the case in which the necessity thereof is low, the speeding-up of the conversion process becomes possible.

In the aspect of the invention, the control circuit may skip the redundancy range addition process in a case in which a size of the conversion range set with the upper limit value and the lower limit value is reduced to a level smaller than a predetermined range width.

With this configuration, it becomes possible to skip such an excessive redundancy range addition process as to prevent the A/D conversion result from converging.

In the aspect of the invention, the control circuit may perform a multiple comparison process of making the comparison circuit perform the comparison process between the analog input signal and the output signal from the D/A conversion circuit a plurality of times in a case in which the conversion range set with the upper limit value and the lower limit value is reduced to a level smaller than the range width.

With this configuration, since the comparison process is performed a plurality of times, it becomes possible to improve the accuracy of the comparison process.

In the aspect of the invention, the circuit device may further include a minute signal determination circuit adapted to determine magnitude of a difference between a voltage level of the analog input signal and a voltage level of the output signal from the D/A conversion circuit, and the control circuit may perform one of the redundancy range addition process and the multiple comparison process in a case in which it has been determined by the minute signal determination circuit that the difference is a minute signal, and skip the redundancy range addition process and the multiple comparison process in a case in which it has been determined by the minute signal determination circuit that the difference is a non-minute signal.

With this configuration, by performing the minute signal determination, it becomes possible to perform the redundancy range addition process or the multiple comparison process in a situation in which the necessity of the redundancy range addition process and the multiple comparison process is high.

In the aspect of the invention, the conversion range at start-up of the successive approximation process may be a predetermined range including previous A/D conversion result data, and the control circuit may set an upper limit value of the predetermined range as a value of the upper limit value register, and sets a lower limit value of the predetermined range as a value of the lower limit value register.

With this configuration, it becomes possible to set the conversion range at the start-up of the comparison process based on the previous A/D conversion result data.

In the aspect of the invention, the control circuit may perform an update of increasing the lower limit value in a case in which a comparison result that a voltage level of the analog input signal is equal to or higher than a voltage level of the output signal from the D/A conversion circuit has been output by the comparison circuit, and perform an update of decreasing the upper limit value in a case in which a comparison result that the voltage level of the analog input signal is lower than the voltage level of the output signal from the D/A conversion circuit has been output by the comparison circuit.

With this configuration, by narrowing the conversion range based on the comparison result, it becomes possible to obtain the A/D conversion result data.

In the aspect of the invention, the control circuit may update the successive approximation data with a value corresponding to an average value of the upper limit value and the lower limit value after the update.

With this configuration, it becomes possible to appropriately update the successive approximation data in accordance with the update of the upper limit value and the lower limit value.

Another aspect of the invention relates to a physical quantity detection device including a physical quantity transducer, and any one of the circuit devices described above adapted to perform A/D conversion to detect a physical quantity based on a detection signal from the physical quantity transducer.

Still another aspect of the invention relates to an electronic apparatus including any one of the circuit devices described above.

Yet another aspect of the invention relates to a vehicle including any one of the circuit devices described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
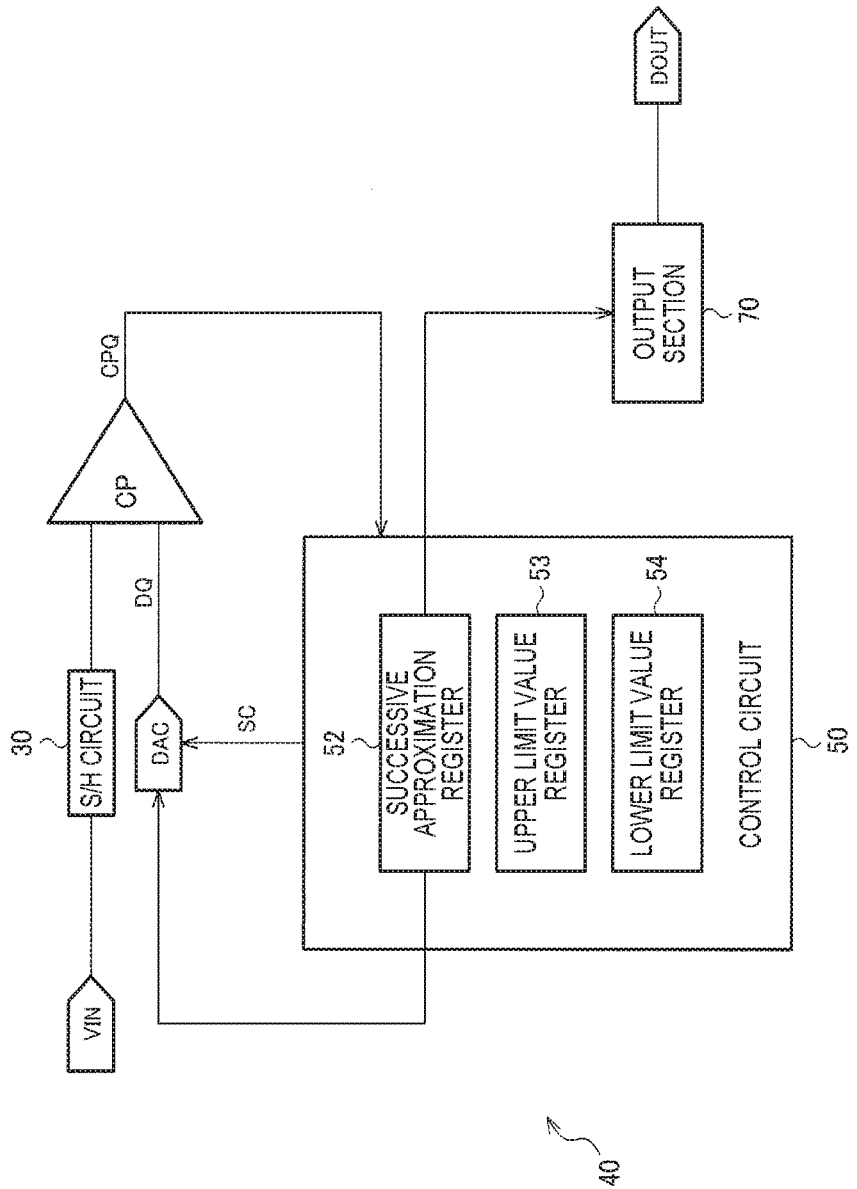
FIG. 1 is a diagram showing a configuration example of an A/D conversion circuit as a circuit device according to an embodiment of the invention.

Hereinafter, some preferred embodiments of the invention will be described in detail. It should be noted that the embodiments described hereinafter do not unreasonably limit the content of the invention as set forth in the appended claims, and all of the constituents described in the embodiments are not necessarily essential as elements of the invention for solving the problems.

1. Method According to Present Embodiment

Firstly, a method of the present embodiment will be described. In the successive approximation type A/D conversion circuit, the speed and the power consumption are determined in accordance with the number of the conversion cycles. The conversion cycle here denotes an operation corresponding to a cycle of performing an D/A conversion of the successive approximation data, then performing a comparison process between the D/A conversion result and an input signal, on which a sample and hold operation has been performed, and then outputting the comparison result. In the case of performing a general A/D conversion process of sequentially determining the data bit by bit from the MSB in, for example, an n-bit A/D conversion circuit, the number of the conversion cycles becomes n.

As a result, in the general A/D conversion process described above, the conversion of the analog input signal (input voltage) is performed using the whole of the full scale 0 through $2^n-1$ of the digital data corresponding to the full-scale voltage VFS as the conversion range. In contrast, if the conversion range can be limited to a narrower range than the full scale, it is possible to reduce the conversion cycles, and speeding-up and reduction in power consumption of the A/D conversion become possible.

For example, as described in Document 2, the upper bits are fixed, and only the lower bits are set to the conversion range. If the upper k bits out of the n bits can be fixed, the conversion range can be limited to a range of $2^{n-k}$ corresponding to the lower n-k bits, and the number of the conversion cycles becomes n-k. Further, since it is sufficient that the conversion range can be limited to a narrower range, it is possible to achieve speeding-up and reduction in power consumption also by setting the upper limit value and the lower limit value of the conversion range to perform the A/D conversion targeting the conversion range set by the upper limit value and the lower limit value as in Document 3.

However, since these methods are the method of eliminating the part other than the conversion range from the search target to thereby realize the speeding-up and so on, it is required for the answer data (the digital data corresponding to the analog input signal) to exist within the conversion range limited narrowly. Therefore, there is a problem that even if the signal significantly deviating from the supposition is input, and the answer data becomes out of the conversion range, the candidate of the digital data to be output is limited to the conversion range, and thus the appropriate conversion cannot be achieved.

In other words, it can be said that the conventional method is a method useful in the case in which the range of the input signal can be supposed to some extent. For example, the method of Document 3 uses the pseudo oversampling, and therefore performs the successive approximation process a plurality of times targeting the same input signal. In the case of performing the second and subsequent successive approximation processes on the given input signal, the A/D conversion result data is expected to be equivalent to the previous A/D conversion result data, and therefore, even if the conversion range is narrowed, the problem is hard to occur. In contrast, in the situation in which the fluctuation of the input signal must be considered, there is a possibility that an appropriate conversion cannot be achieved as described above.

In contrast, it is also possible to adopt a method that whether or not the answer data is out of the conversion range is determined, and then the conversion range is changed in the case in which the answer data is out of the conversion range. By adopting such a configuration, even in the case in which the signal significantly deviating from the supposition has been input, an appropriate conversion result can be obtained. However, in this case, it results that there occurs the determination cycle on whether or not the answer data has been out of the conversion range, and an increase in the number of the conversion cycles is incurred. Despite that the method of limiting the conversion range intends to reduce the number of the conversion cycles to thereby achieve the speeding-up and the reduction in power consumption in the first place, the increase in the number of the cycles due to the determination cycle impairs the effectiveness.

Therefore, the applicant proposes a method of achieving both of speeding-up and acquisition of an error-free conversion result. A circuit device 40 according to the present embodiment is a circuit device for performing the A/D conversion on the analog input signal, and includes a control circuit 50 having a successive approximation register 52 for holding the successive approximation data, a D/A conversion circuit DAC for performing the D/A conversion on the output data (the successive approximation data) from the successive approximation register 52, and a comparison circuit CP for performing comparison process between the analog input signal VIN and the output signal DQ from the D/A conversion circuit DAC as shown in FIG. 1. Further, the control circuit 50 has an upper limit value register 53 for holding the upper limit value of the conversion range of the A/D conversion result data obtained by the A/D conversion of the analog input signal, and a lower limit value register 54 for holding the lower limit of the conversion range, and performs at least either one of an update of increasing the upper limit value and an update of decreasing the lower limit value in the case in which the comparison circuit CP outputs the same comparison result equal to or more than a predetermined number of times in the successive approximation process.

It should be noted that the circuit device 40 can also include an S/H circuit 30 for sampling and holding the analog input signal VIN to be the target of the A/D conversion, and an output section 70 for outputting the output data DOUT based on the A/D conversion result data obtained by the successive approximation operation as shown in FIG. 1. It should be noted that the configuration of the circuit device 40 is not limited to the configuration shown in FIG. 1, but a variety of practical modifications such as elimination of some of the constituents or addition of other constituents are possible. For example, in the case of using a charge redistribution type D/A conversion circuit DAC as described later using FIG. 5 and FIG. 6, the function of the S/H circuit 30 can be realized by the D/A conversion circuit DAC.

Here, the successive approximation process denotes a process performed in a period of obtaining the A/D conversion result data once, wherein the A/D conversion result data corresponds to the analog input signal VIN. Specifically, the successive approximation process corresponds to a process of repeating the conversion cycle described above a plurality of times, and corresponds to the process of the entire flowchart shown in FIG. 7 described later. Further, in the present embodiment, a process performed until the A/D conversion result data corresponding to the analog input signal VIN is fixed and then output as the output data DOUT is referred to as an A/D conversion process. In general, it is sufficient to use the A/D conversion result data obtained by a single successive approximation process as the output data DOUT, and a single A/D conversion process is performed by a single successive approximation process. It should be noted that it is also possible to obtain a single output data DOUT using a plurality of A/D conversion result data as in the case of the pseudo oversampling of Document 3, and in that case, a plurality of successive approximation processes is performed as a result in the single A/D conversion process.

Further, the comparison result (a comparison result signal CPQ) from the comparison circuit CP is information representing either one of (first input)≥(second input) and (first input)<(second input) in the case of a two-input comparison circuit. More specifically, the comparison result is the information representing which one of VIN<DQ and VIN≥DQ is fulfilled by the analog input signal VIN and the output signal DQ from the D/A conversion circuit DAC as the D/A conversion result of the successive approximation data.

According to the method of the present embodiment, in the case in which the same comparison result is output a predetermined number of times, the update of at least one of the increase in the upper limit value and the decrease in the lower limit value is performed. As described later, in the successive approximation process, the A/D conversion result data is obtained by narrowing the conversion range by decreasing the upper limit value or increasing the lower limit value. Therefore, according to the conventional method, if the answer data does not exist in the initial value (the initial range) of the conversion range, the appropriate A/D conversion result data cannot be obtained no matter how the conversion range is narrowed. In this regard, in the method according to the present embodiment, there are performed the update processes in the reverse direction such as increasing the upper limit value and decreasing the lower limit value. Therefore, it becomes possible to newly include the range, which is outside the initial value of the conversion range, in the conversion range, and thus, it becomes possible to obtain the error-free conversion result.

Further, in the present embodiment, the fact that the same comparison result is output a predetermined number of times is used as a trigger to perform the update of at least one of the increase in the upper limit value and the decrease in the lower limit value. The comparison performed in the comparison circuit CP is nothing but the comparison process between the D/A conversion result of the successive approximation data and the analog input signal VIN, and therefore, the comparison process dedicated to expanding the conversion range is not necessarily required. Therefore, an excessive increase in the conversion cycle can be prevented.

Figure 2:
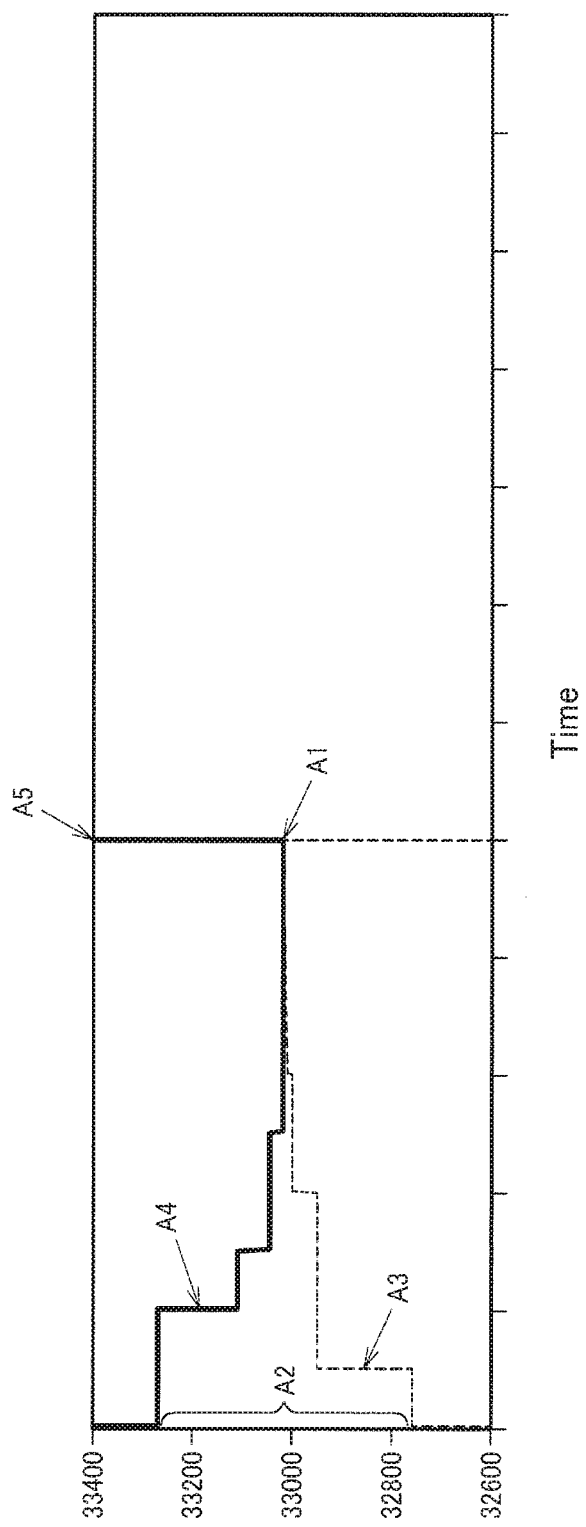
FIG. 2 is a simulation diagram showing a transition of the conversion range.
Figure 3:
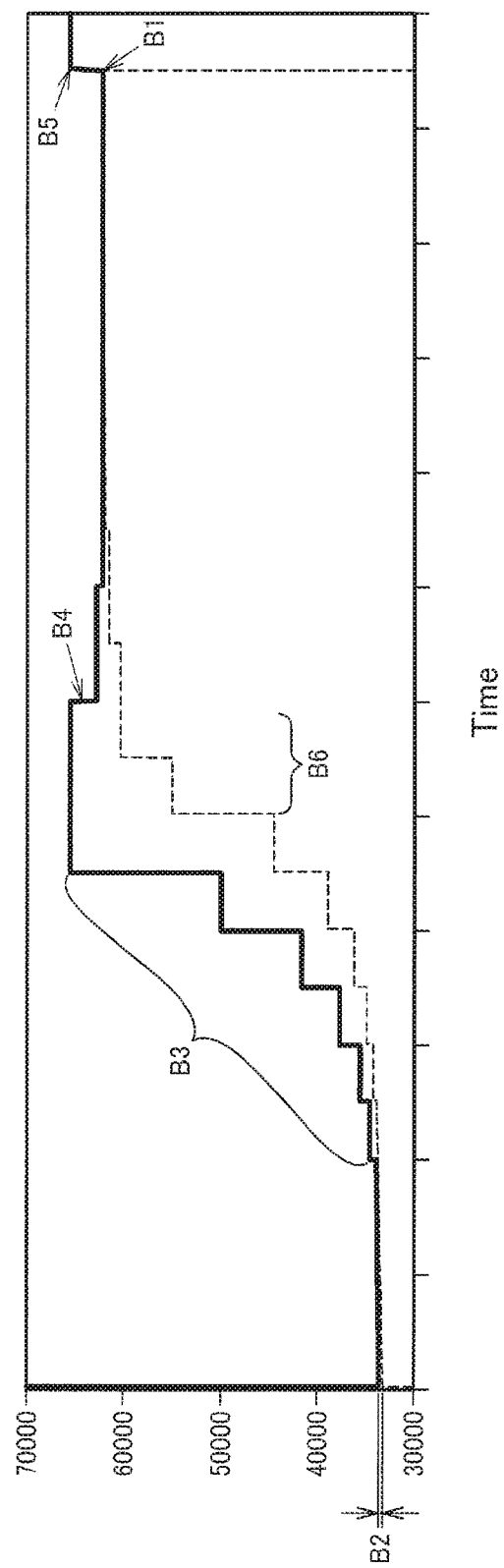
FIG. 3 is a simulation diagram showing a transition of the conversion range.

FIG. 2 and FIG. 3 are simulation diagrams for explaining the transition of the conversion range. The vertical axis represents the value of the digital data, and the horizontal axis represents the time. Further, the solid line represents the transition of the upper limit value, and the dotted line represents the transition of the lower limit value. It should be noted that although in FIG. 2 and FIG. 3, there is shown an example of performing redundancy range addition described later using FIG. 11 and so on, this configuration is not necessarily required.

FIG. 2 shows an example of the case in which the variation of the analog input signal VIN is small, and the answer data A1 is included in the conversion range A2. In this case, the conversion range gradually narrows due to the increase (e.g., A3) in the lower limit value and the decrease (e.g., A4) in the upper limit value, and at the timing indicated as A5, the A/D conversion result is obtained. In other words, FIG. 2 shows the case in which the initial value of the conversion range has no problems, and by setting the conversion range narrower compared to the full scale, speeding-up is realized.

FIG. 3 shows an example in which the variation of the analog input signal VIN is large, and the answer data B1 is out of the conversion range B2. In the example shown in FIG. 3, the analog input signal VIN is higher compared to the D/A conversion result (DQ) of the successive approximation data (either of the digital data in the conversion range), the comparison result of VIN≥DQ continues. Thus, in the control circuit 50 according to the present embodiment, the upper limit value of the conversion range is increased as indicated by B3. Thus, the answer data becomes within the conversion range, and the comparison result of VIN<DQ is also output. As a result, the upper limit value also starts decreasing as indicated by B4, and at the timing indicated by B5, the A/D conversion result is obtained.

It should be noted that as a result, by increasing the upper limit value or decreasing the lower limit value, the area which has once been out of the conversion range is newly included in the conversion range. In other words, the search target of the answer data increases as a result, and the number of the conversion cycles increases. In the case in which the amount of the increase is excessively large, the advantages of the speeding-up and the reduction of the power consumption are impaired. Therefore, the applicant conducted a test also on this point.

Figure 4:
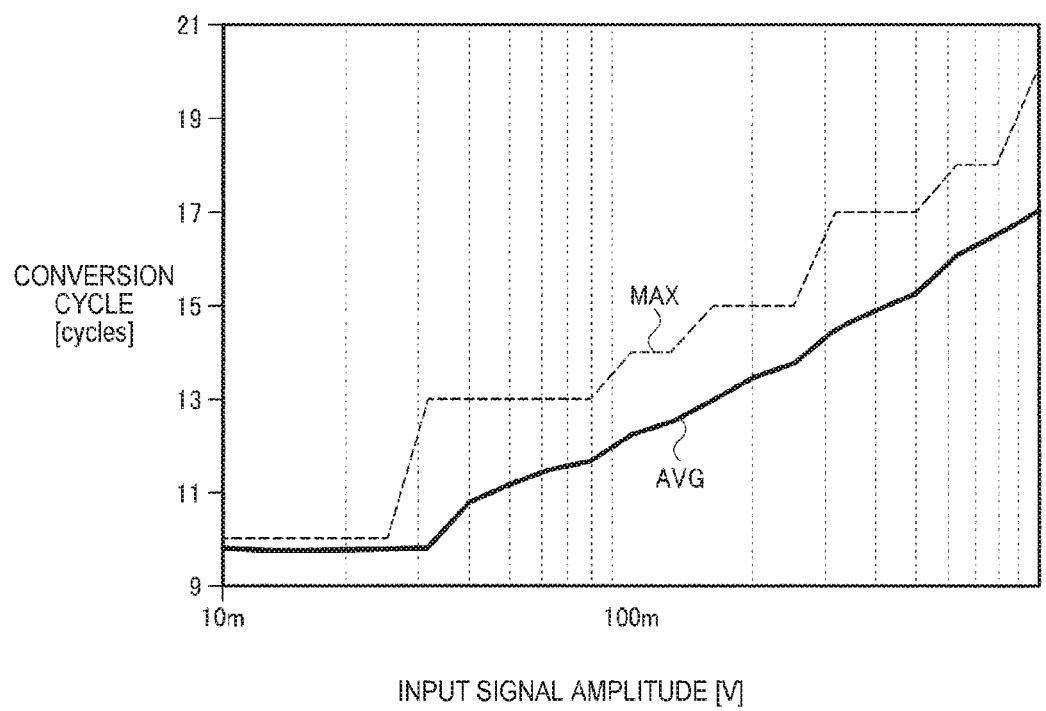
FIG. 4 is a diagram showing a relationship between the input signal amplitude and the number of cycles.

FIG. 4 is a diagram showing the relationship between the amplitude of the analog input signal VIN and the number of the conversion cycles. The horizontal axis represents the amplitude of the analog input signal VIN, and shows whether or not the analog input signal VIN is apt to change. The vertical axis represents the number of the conversion cycles. The line AVG represents an average value of the number of the conversion cycles, and the line MAX represents the maximum value of the number of the conversion cycles. Further, in FIG. 4, there is obtained the result in which the redundancy range addition described later is also taken into consideration.

Since the 16-bit A/D conversion is assumed here, in the case of the A/D conversion targeting the full scale, the number of the conversion cycles becomes 16. As shown in FIG. 4, in the method according to the present embodiment, the larger the amplitude of the analog input signal VIN is, the more both of the average value and the maximum value of the number of the conversion cycles are increasing. In a range in which the amplitude is small, the number of the conversion cycles is 10, which makes the speeding-up possible compared to the original number of cycles of 16. Further, even if the amplitude increases to a level of about 500 mV, the number of the conversion cycles is less than or comparable to 17, and the increment to the original number of cycles of 16 is not so large.

As shown in FIG. 4, in the case of the range of the input signal amplitude assumed in the present embodiment, even if the increase in the upper limit value or the decrease in the lower limit value is performed, the advantage of the speeding-up and the reduction in power consumption is significant. In other words, according to the method of the present embodiment, it is possible to realize the appropriate A/D conversion achieving the balance between the speed and the conversion accuracy.

Hereinafter, a specific configuration example of the circuit device 40 according to the present embodiment will be described, and then a specific process flow of the successive approximation process will be described. In conclusion, some examples of a variety of devices including the circuit device according to the present embodiment will be described.

2. Configuration Example of Circuit Device

Then, an example of the circuit device 40 according to the present embodiment will be described. It should be noted that there will hereinafter be described an example in which the D/A conversion circuit DAC included in the circuit device 40 as the A/D conversion circuit is a charge redistribution type D/A conversion circuit, and DEM (dynamic element matching) is applied to the MSB side thereof. It should be noted that the circuit device 40 according to the present embodiment is not limited to the configuration described later using FIG. 5 and FIG. 6, but a variety of practical modification are possible.

Figure 5:
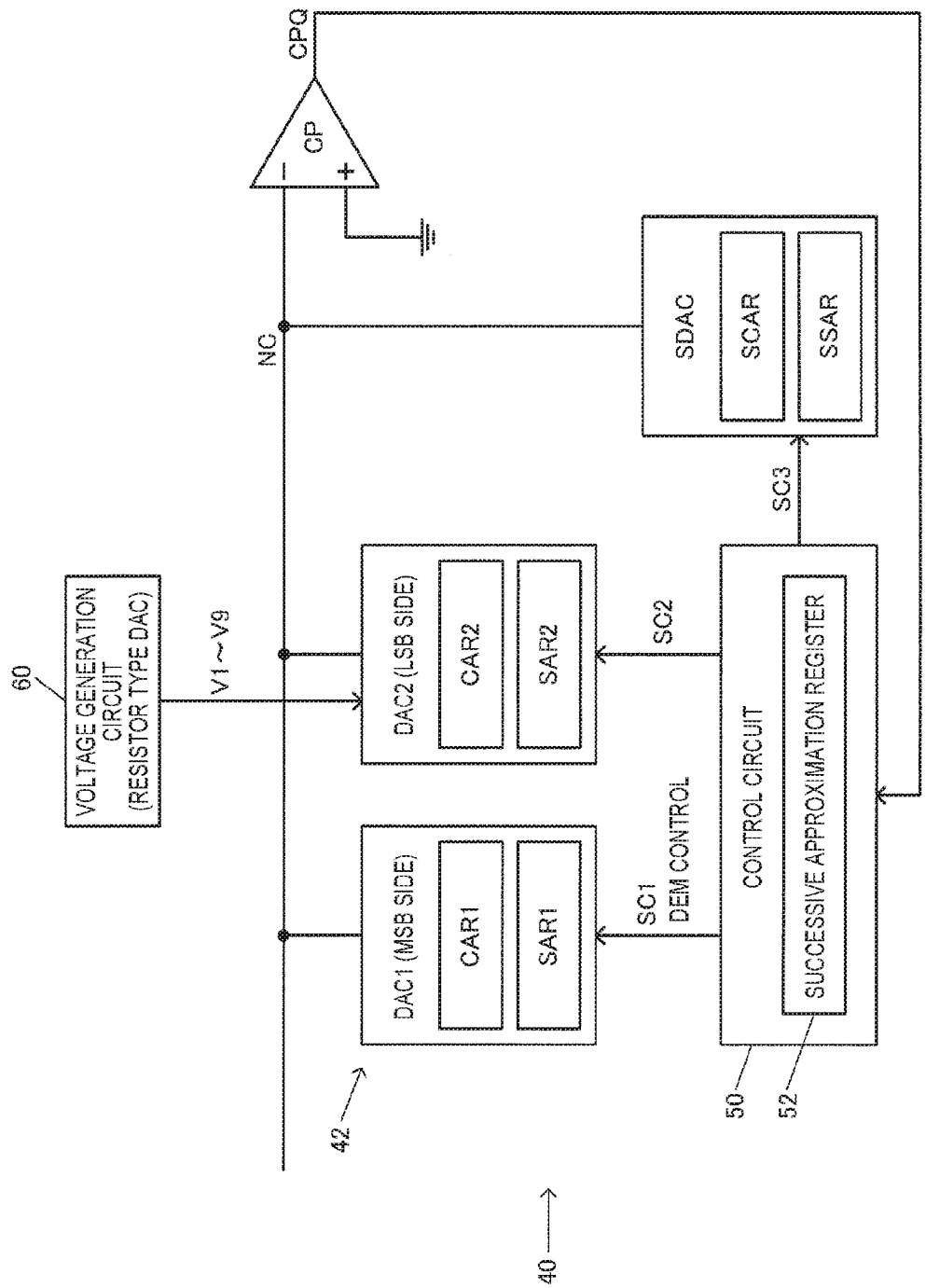
FIG. 5 is a diagram showing a configuration example of the A/D conversion circuit as the circuit device according to the embodiment of the invention.

FIG. 5 is a diagram showing a configuration example of the successive approximation type A/D conversion circuit as the circuit device 40 according to the present embodiment. The circuit device 40 includes a capacitor circuits (CAR1, SAR1, CAR2, and SAR2), and a control circuit 50 (a processing section, a logic section) for outputting switch control signals (SC1, SC2). For example, the circuit device 40 (the A/D conversion circuit) has a comparison circuit CP (a comparator), a D/A conversion circuit 42 (DAC1, DAC2), and the control circuit 50, wherein the capacitor arrays (CAR1, CAR2) are connected to the comparison node NC (sampling node) of the comparison circuit CP, the D/A conversion circuit 42 (DAC1, DAC2) have the capacitor arrays (CAR1, CAR2) and switch arrays (SAR1, SAR2), respectively, and perform the charge redistribution type D/A conversion. Further, the control circuit 50 generates the switch control signals (SC1, SC2) based on the comparison result (CPQ) of the comparison circuit CP to output the switch control signals to the switch arrays (SAR1, SAR2).

Specifically, the D/A conversion circuit 42 (corresponding to the DAC in FIG. 1) includes a D/A conversion circuit DAC1 on the MSB side (higher bit side), and a D/A conversion circuit DAC2 on the LSB side (lower bit side), and a sub-D/A conversion circuit SDAC. The D/A conversion circuit DAC1 on the MSB side includes the capacitor array CAR1 and the switch array SAR1. The D/A conversion circuit DAC2 on the LSB side includes the capacitor array CAR2 and the switch array SAR2. For example, the other ends of the capacitor arrays CAR1, CAR2 are connected to the comparison node NC. The comparison node NC is connected to an inverting input terminal (a first terminal) of the comparison circuit CP, and a non-inverting input terminal (a second terminal) of the comparison circuit CP is set to be GND (the reference voltage). One ends of the capacitor arrays CAR1, CAR2 are connected to the switch arrays SAR1, SAR2, respectively. Further, the switch arrays SAR1, SAR2 are controlled by the switch control signals SC1, SC2 from the control circuit 50, respectively.

It should be noted that the sub-D/A conversion circuit SDAC is a D/A conversion circuit for a variety of types of adjustment, and includes a capacitor array SCAR and a switch array SSAR. One end of the capacitor array SCAR is connected to the switch array SSAR, and the other end of the capacitor array SCAR is connected to the comparison node NC. The switch array SSAR is controlled by the switch control signal SC3 from the control circuit 50. Due to the sub-D/A conversion circuit SDAC, there can be realized processes such as trimming adjustment of the variation of the capacitance and a code shift.

The control circuit 50 performs a variety of processes for the successive approximation A/D conversion. Then, the control circuit 50 outputs the switch control signals SC1, SC2 to the D/A conversion circuits DAC1, DAC2, respectively. For example, the control circuit 50 includes a successive approximation register 52 to which the register value is set by the comparison result signal CPQ from the comparison circuit CP to generate data for successive approximation. The D/A conversion circuit 42 functions as a circuit for performing the D/A conversion on the data for successive approximation. Specifically, the switch control signals SC1, SC2 corresponding to the data for successive approximation are output from the control circuit 50. Then, the D/A conversion circuits DAC1, DAC2 of the D/A conversion circuit 42 perform the charge redistribution type D/A conversion based on the switch control signals SC1, SC2, respectively.

On this occasion, the control circuit 50 outputs the switch control signal SC1 due to the DEM (dynamic element matching) control with respect to the D/A conversion circuit DAC1 on the MSB side. As the DEM control, a method using a circuit system, for example, can be adopted. By performing such DEM control as described above, it becomes possible to provide a random nature to the combination pattern of the capacitors selected by the switch control signal (the data for successive approximation) in the capacitor array, and it is possible to improve the accuracy of the ratio of the apparent capacitances of the capacitors.

Further, the circuit device 40 shown in FIG. 5 is provided with a voltage generation circuit 60. As the voltage generation circuit 60, there can be used a resistance type DAC (e.g., a resistor ladder type DAC, an R2-R ladder type DAC). The voltage generation circuit 60 generates binary-weighted voltages V1 through V9 to supplies the result to the D/A conversion circuit DAC2 on the LSB side. For example, the voltage generation circuit 60 generates the voltages such as V9=VDD/2, V8=VDD/4, V7=VDD/8, V6=VDD/16, . . . and V1=VDD/512, and then supplies the voltages to the D/A conversion circuit DAC2. The D/A conversion circuit DAC2 performs the charge redistribution type D/A conversion using these voltages V1 through V9.

Figure 6:
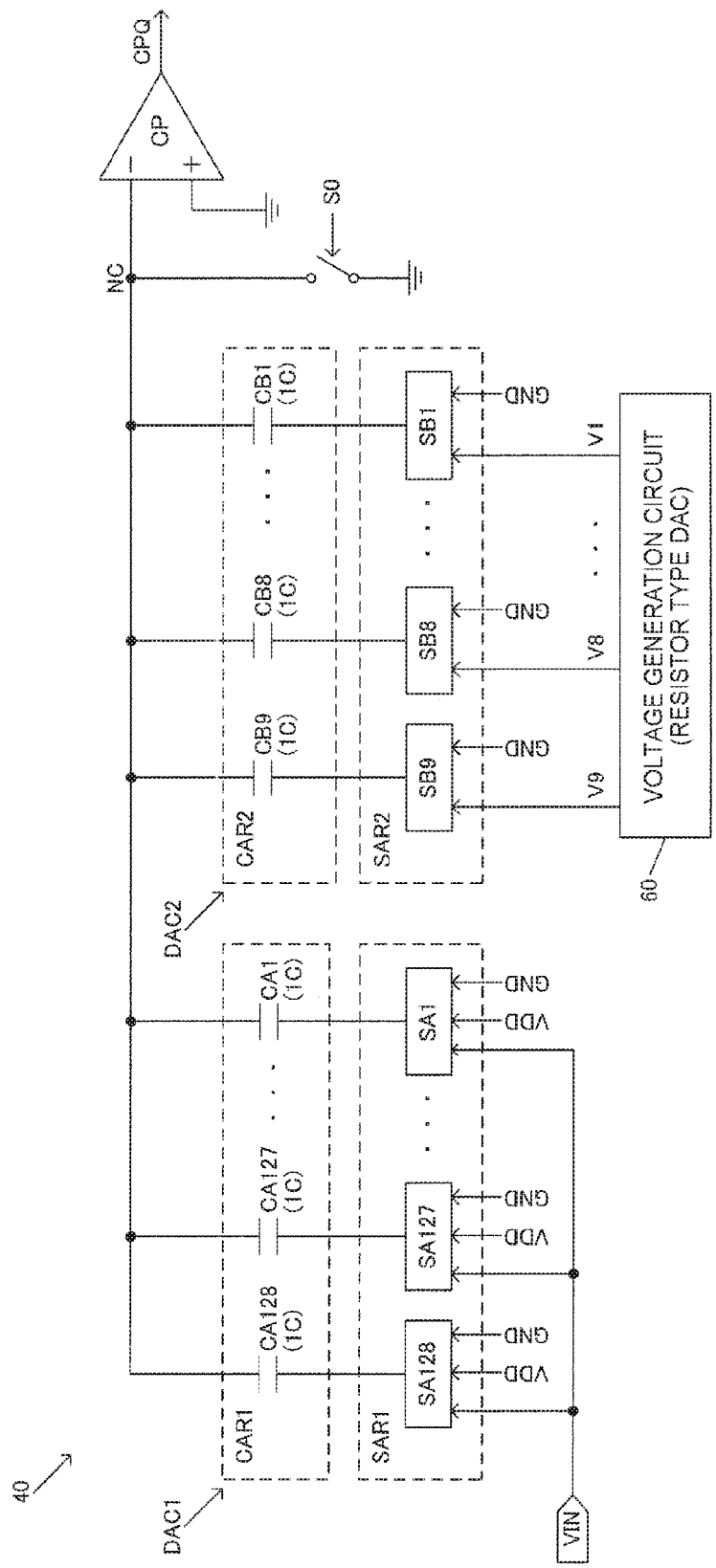
FIG. 6 is a diagram showing a detailed configuration example of the A/D conversion circuit.

FIG. 6 is a diagram showing a detailed configuration example of the A/D conversion circuit as the circuit device 40 according to the present embodiment. The A/D conversion circuit performs 16-bit successive approximation A/D conversion. The 16-bit A/D conversion is realized by, for example, 7-bit charge redistribution type D/A conversion by the D/A conversion circuit DAC1 on the MSB side, and 9-bit charge redistribution type D/A conversion by the D/A conversion circuit DAC2 on the LSB side.

The capacitor array CAR1 of the D/A conversion circuit DAC1 on the MSB side includes capacitors CA1 through CA128 the other ends of which are connected to the comparison node NC. These capacitors CA1 through CA128 are each a unit capacitor having a capacitance value of 1 C. The switch array SAR1 includes switch circuits SA1 through SA128, and one ends of the capacitors CA1 through CA128 are respectively connected to one ends of the switch circuits SA1 through SA128. The other ends of each of the switch circuits SA1 through SA128 are respectively supplied with an input voltage (the analog input signal VIN), a reference voltage VDD on the high potential side, and the reference voltage GND on the low potential side. The switch circuits SA1 through SA128 are switch-controlled by the switch control signal SC1 for the DEM control. Further, to the comparison node NC, there is connected a switch circuit S0 for controlling supply/non-supply of the reference voltage GND on the low potential side.

The capacitor array CAR2 of the D/A conversion circuit DAC2 on the LSB side includes capacitors CB1 through CB9 the other ends of which are connected to the comparison node NC. These capacitors CB1 through CB9 are each a unit capacitor having a capacitance value of 1 C. The switch array SAR2 includes switch circuits SB1 through SB9, and one ends of the capacitors CB1 through CB9 are respectively connected to one ends of the switch circuits SB1 through SB9. The other ends of the switch circuits SB1 through SB9 are respectively supplied with the voltages V1 through V9 from the voltage generation circuit 60 (the resistance type DAC), and the reference voltage GND on the low potential side. For example, the switch circuit SB1 is supplied with the voltage V1 and GND, and the switch circuit SB2 is supplied with the voltage V2 and GND. Substantially the same applies to the other switch circuits SB3 through SB9.

The operation of the circuit device 40 shown in FIG. 6 will briefly be described. In the sampling period of the analog input signal VIN, the switch circuit S0 is set to the ON state to thereby connect the comparison node NC to GND, and the switch circuits SA1 through SA128 of the D/A conversion circuit DAC1 on the MSB side select VIN. On this occasion, the switch circuits SB1 through SB9 on the LSB side select, for example, GND. Thus, VIN is supplied to the one ends of the capacitors CA1 through CA128, and the charge corresponding to VIN is stored in each of the capacitors. Then, after the end of the sampling period, the A/D conversion operation due to the successive approximation is performed.

On this occasion, the switch circuit S0 is set to the OFF state, and the potential of the comparison node NC changes in accordance with the control states of the switch circuits SA1 through SA128, and the switch circuits SB1 through SB9. The switch circuits SA1 through SA128 of the D/A conversion circuit DAC1 are switch-controlled by the DEM control using, for example, a circuit system. For example, firstly, a pointer of the DEM is set to the position of the capacitor CA1 (e.g., P=0). Then, the n switch circuits SA1 through SAn, which are determined by the switch control signal SC1 corresponding the successive approximation data (in particular, the upper 7 bits among the successive approximation data), started from the position of the pointer select VDD, and the rest of the switch circuits, namely 128-$n$ switch circuits SAn+1 through SA128 select GND. Thus, the one ends of the capacitors CA1 through CAn are supplied with VDD, and the one ends of the capacitors CAn+1 through CA128 are supplied with GND. For example, if the upper 7 bits of the successive approximation data is "1000000," n=64 is obtained.

Then, at least one of the upper limit value and the lower limit value of the conversion range is updated in accordance with whether the comparison result signal CPQ of the comparison circuit CP is the H level (an active level) or the L level (an inactive level), and then the update of the successive approximation data is performed based on the upper limit value and the lower limit value after the update. A specific method of the update will be described later. In the D/A conversion circuit DAC1, it is sufficient to determine the switch circuits required to select VDD and the switch circuits required to select GND among the switch circuits SA1 through SA128 based on the DEM pointer and the successive approximation data updated.

In such a manner as described above, the successive approximation process with respect to the analog input signal VIN is performed. Further, the position of the next capacitor to the position of the last one of the selected capacitors at the end of the successive approximation process is used in the subsequent successive approximation process. For example, in the case in which the switch circuits SA1 through SA40 select VDD (P=0), and the switch circuits SA41 through SA128 select GND at the end of the successive approximation process, the control of the DEM is performed using the value (P=40) indicating the capacitor CA41 next to the capacitor CA40 as the DEM pointer P in the next cycle of the successive approximation process.

In contrast, in the D/A conversion circuit DAC2 on the LSB side, such control of the DEM is not performed. Further, the D/A conversion circuit DAC2 performs the charge redistribution D/A conversion using the binary-weighted voltages V1 through V9 input to the switch circuits SB1 through SB9. By adopting such a configuration, it becomes possible to realize high-resolution and high-precision A/D conversion without adopting the configuration of providing a series capacitor between the D/A conversion circuit DAC1 and the D/A conversion circuit DAC2.

3. Details of Successive-Approximation Process

Then, the details of the successive approximation process according to the present embodiment will be described. Firstly, there will be described a detailed flow of the method of extending the conversion range in the case in which the same comparison result is output a predetermined number of times. Subsequently, there will be described a method of improving the comparison processing by adding a redundancy range. Further, there will be described a method of performing a minute signal determination even in the case in which it is difficult to add the redundancy range.

3.1 Extension of Conversion Range

Firstly, a method of extending the conversion range will be described. It should be noted that the "extension" here denotes, in a narrow sense, the fact that the size (i.e., width, a value of (upper limit value)–(lower limit value)) of the conversion range increases due to the update of the conversion range, but is not limited to this definition. The extension of the conversion range can also include the fact that the range which has not ever been included in the conversion range is newly added to the conversion range due to the update of the conversion range. For example, the case in which the upper limit value is increased, and at the same time, the lower limit value is increased with a larger increment than that of the upper limit value is also regarded here as the "extension of the conversion range."

Figure 7:
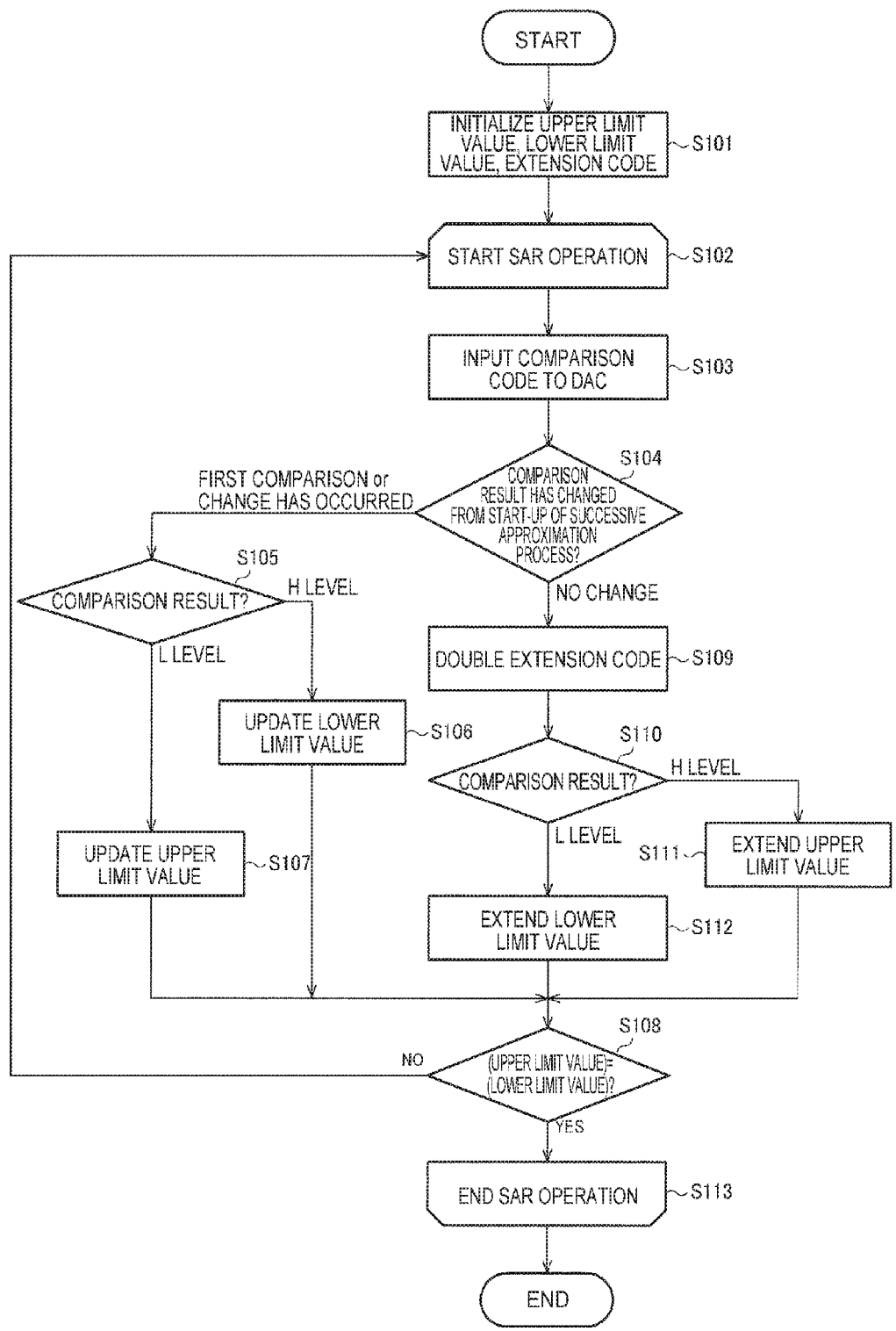
FIG. 7 is a flowchart for explaining a successive approximation process according to the embodiment.
Figure 8:
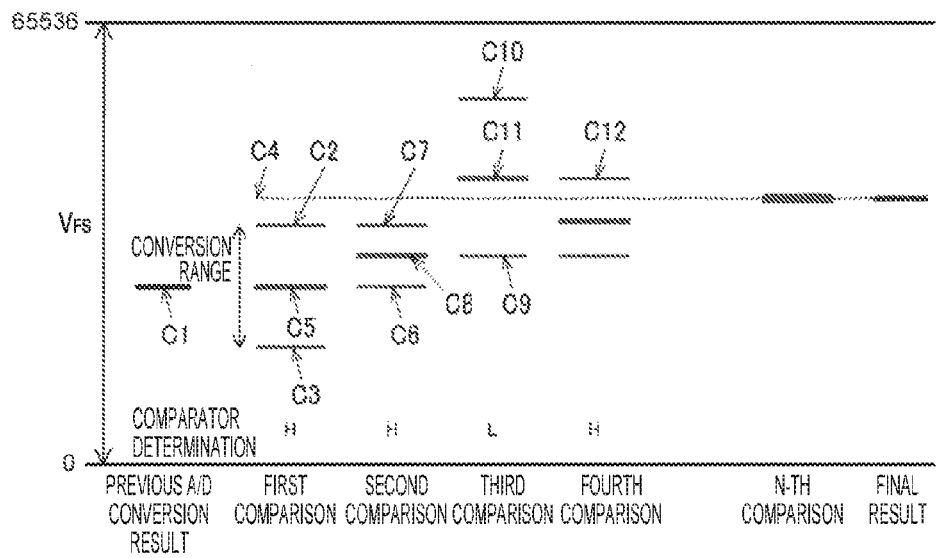
FIG. 8 is a diagram showing an example of updating an upper limit value, a lower limit value, and successive approximation data.
Figure 9:
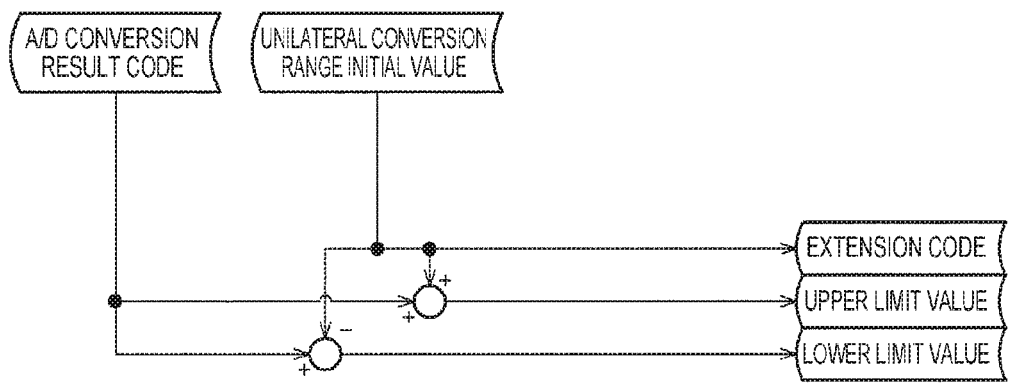
FIG. 9 is an explanatory diagram of a register operation of the embodiment.
Figure 10:
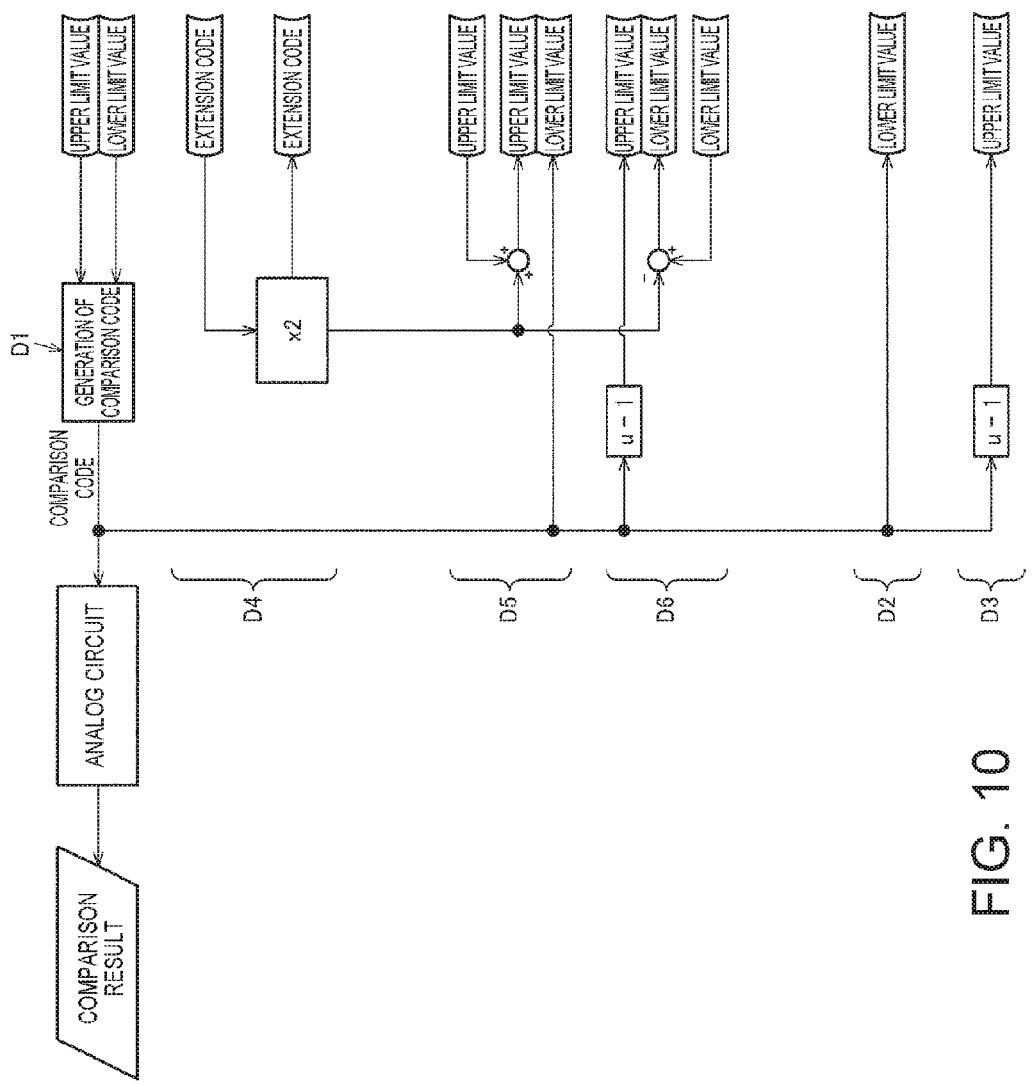
FIG. 10 is an explanatory diagram of a register operation of the embodiment.

FIG. 7 is a flowchart for explaining the successive approximation process performed in the control circuit 50. FIG. 8 is an example of the update of the upper limit value, the lower limit value, and a comparison code (the successive approximation data). Further, FIG. 9 and FIG. 10 are diagrams for explaining a register operation. The flow of the process performed in the control circuit 50 will hereinafter be described along the flowchart shown in FIG. 7, and at the same time, the details and the specific examples of each step will be described with reference to FIG. 8 through FIG. 10 as needed. It should be noted that since the 16-bit A/D conversion is assumed in FIG. 8, the full scale of the digital data corresponding to the full scale voltage VFS becomes in a range of no smaller than 0 and smaller than 65536.

When the successive approximation process is started, the control circuit 50 first performs (step S101) an initialization process of the upper limit value and the lower limit value of the conversion range, and an extension code. It is advisable to set the conversion range at the start-up of the successive approximation process to a predetermined range including the previous A/D conversion result data. Then, the control circuit 50 sets the upper limit value of the predetermined range to a value of the upper limit value register, and sets the lower limit value of the predetermined range to a value of the lower limit value register.

According to this configuration, it becomes possible to set the initial values of the conversion range based on the previous A/D conversion result data. Although depending on the acquisition rate (execution rate of the successive approximation process) of the A/D conversion result data and the characteristic of the analog input signal VIN, it is conceivable that in many cases, the analog input signal VIN does not dramatically change between the previous successive approximation process and the present successive approximation process. Therefore, by setting the conversion range including the previous A/D conversion result data, it is possible to increase the possibility that the answer data exists in the conversion range, and speeding-up of the conversion process and so on become possible.

FIG. 9 is a diagram for explaining the operations of the upper limit value register 53, the lower limit register 54, and an extension code register. As shown in FIG. 9, the control circuit 50 stores data, which is obtained by adding a unilateral conversion range initial value to the previous A/D conversion result data, in the upper limit value register 53 as the upper limit value, and stores data, which is obtained by subtracting the unilateral conversion range initial value from the previous A/D conversion result data, in the lower limit value register 54 as the lower limit value. The unilateral conversion range initial value here is a value corresponding to a size a half as large as the width of the predetermined range described above. Therefore, due to the initialization shown in FIG. 9, it becomes possible to set the initial value of the conversion range to a predetermined range centered on the previous A/D conversion result data.

Further, the extension code here is the digital data representing the increment in the case of increasing the upper limit value, or the decrement in the case of decreasing the lower limit value. The initial value of the extension code can variously be set, but in the example shown in FIG. 9, the control circuit 50 stores the unilateral conversion range initial value in the extension code register as the initial value of the extension code.

The reference symbols C1 through C3 in FIG. 8 correspond to the step S101. The upper limit value is set (C2) to a level higher than the previous A/D conversion result data (C1) as much as the unilateral conversion range initial value, and the lower limit value is set (C3) to a level lower than the previous A/D conversion result data (C1) as much as the unilateral conversion range initial value. The first comparison process in the comparison circuit CP is performed targeting the conversion range determined by C2 and C3.

After setting the initial values, the control circuit 50 starts (step S102) a loop process of the successive approximation. Firstly, the control circuit 50 generates the comparison code, and then inputs (step S103) the comparison code to the D/A conversion circuit DAC. As indicated by the reference symbol D1 in FIG. 10, the generation of the comparison code is performed based on the upper limit value and the lower limit value. It is sufficient for the comparison code to be set to a value lower than the upper limit value and higher than the lower limit value. For example, it is sufficient for the control circuit 50 to set an average value of the upper limit value and the lower limit value, or a value approximate as the average value to the comparison code.

Then, the control circuit 50 determines (step S104) whether or not the comparison result has changed from the start-up of the successive approximation process based on the comparison result (the comparison result signal CPQ) as an output of the comparison circuit CP. In the case of the first comparison or in the case in which the comparison result has changed, the control circuit 5 makes the transition to the step S105.

The control circuit 50 determines (step S105) the comparison result, and updates the upper limit value or the lower limit value in accordance with the comparison result. Specifically, in the case in which the comparison circuit CP has output the comparison result that the voltage level of the analog input signal VIN is equal to or higher than the voltage level of the output signal DQ (the D/A conversion result of the comparison code) from the D/A conversion circuit DAC, the control circuit 50 increases the lower limit value. Further, in the case in which the comparison circuit CP has output the comparison result that the voltage level of the analog input signal VIN is lower than the voltage level of the output signal DQ from the D/A conversion circuit DAC, the control circuit 50 performs the update of decreasing the upper limit value. Hereinafter, the comparison result that the voltage level of the analog input signal is equal to or higher than the voltage level of the output signal DQ from the D/A conversion circuit DAC is described as an "H level," and the comparison result that the voltage level of the analog input signal is lower than the voltage level of the output signal DQ from the D/A conversion circuit DAC is described as a "L level."

As shown in FIG. 7, the control circuit 50 updates (step S106) the lower limit value in the case in which the output of the comparison circuit CP is in the H level, and updates (step S107) the upper limit value in the case in which the output of the comparison circuit CP is in the L level. Specifically, it is conceivable that in the case in which the comparison result is in the H level, the answer data exists in a range equal to or higher than the comparison code. Therefore, as indicated by the reference symbol D2 in FIG. 10, it is sufficient for the control circuit 50 to perform the update of setting the value of the comparison code to the lower limit value. Further, it is conceivable that in the case in which the comparison result is in the L level, the answer data exists in a range lower than the comparison code. Therefore, as indicated by the reference symbol D3 in FIG. 10, it is sufficient for the control circuit 50 to perform the update of setting the value obtained by decrementing the comparison code to the upper limit value.

In FIG. 8, the answer data corresponds to the dotted line indicated by the reference symbol C4. Therefore, in the comparison process using the comparison code (C5) set based on the initial values (C2, C3) of the conversion range, the result of the H level is output. Therefore, the control circuit 50 updates (C6) the lower limit value with the value of the comparison code. In this case, regarding the upper limit value, the previous value is maintained (C7).

After the update of the upper limit value or the lower limit value, the control circuit 50 determines (step S108) whether or not (upper limit value)=(lower limit value) is true. In the case of YES in the step S108, the control circuit 50 terminates (step S113) the loop process, and also terminates the single successive approximation process.

In the case of NO in the step S108, the control circuit 50 continues the loop process from the step S102. Specifically, the control circuit 50 updates (step S103) the successive approximation data with the value corresponding to the average value of the updated upper limit value and the updated lower limit value, and then performs the determination on the comparison result. According to such a configuration as described above, since the successive approximation data corresponding to the update result of the upper limit value and the lower limit value can be generated, it becomes possible to obtain the A/D conversion result data by repeating the comparison process.

In the example shown in FIG. 8, the comparison code C8 is generated based on the lower limit value C6 and the upper limit value C7. Here, since C4>C8 is true, the H level is also obtained as the second comparison result. In other words, the comparison result does not change from the start-up of the successive approximation process, namely the same comparison result has been output a predetermined number of times (twice, here) as a result. Therefore, the control circuit 50 determines "no change" in the step S104, and then performs a process of extending the conversion range.

The control circuit 50 first performs (step S109) the update of increasing the extension code. It is sufficient to perform the process of doubling the extension code as indicated by the reference symbol D4 in FIG. 10, and this can be realized by, for example, a bit shift operation. As described above, the extension code corresponds to the increment of the upper limit value or the decrement of the lower limit value. If the value of the extension code is too large, since the width of the conversion range is apt to become too large, the number of cycles performed before the convergence (the number of the cycles performed until (upper limit value)=(lower limit value) becomes true, and the A/D conversion result data is obtained) increases, and there is a possibility that the advantage of the speeding-up is impaired. On the other hand, if the value of the extension code is too small, the necessary number of times of the extension increases, and the number of the cycles performed before the convergence increases after all. Therefore, in the present embodiment, in the condition in which the initial value of the extension code is limited to a moderate value, the extension code is increased every time the extension is performed to thereby achieve the balance. According to this configuration, if the degree of the deviation of the answer data from the conversion range is small, there is no chance to excessively extend the conversion range, and further, even in the case in which the degree of the deviation of the answer data from the conversion range is significant, it becomes possible to appropriately include the answer data in the conversion range with a small number of times of the extension. It should be noted that a variety of practical modifications such as performing the process of the step S109 in the posterior stage, or skipping the update of the extension code, are also possible.

Further, the control circuit 50 performs (step S110) the determination of the comparison result, and performs the update of increasing the upper limit value in the case in which the comparison circuit CP outputs the comparison result (the H level) that the voltage level of the analog input signal VIN is equal to or higher than the voltage level of the output signal DQ from the D/A conversion circuit DAC a predetermined number of times or more, and decreasing the lower limit value in the case in which the comparison circuit CP outputs the comparison result (the L level) that the voltage level of the analog input signal VIN is lower than the voltage level of the output signal DQ from the D/A conversion circuit DAC a predetermined number of times or more.

In other words, in the case of the H level in the step S110, the control circuit 50 increases (step S111) the upper limit value. Specifically, as indicated by the reference symbol D5 in FIG. 10, a value obtained by adding the extension code to the present upper limit value is set as a new upper limit value. Further, as indicated by D5, in the step S111, it is also possible to additionally perform the update process of setting the comparison code to the lower limit value similarly to the step S106.

Further, in the case of the L level in the step S110, the control circuit 50 decreases (step S112) the lower limit value. Specifically, as indicated by the reference symbol D6 in FIG. 10, a value obtained by subtracting the extension code from the present lower limit value is set as a new lower limit value. Further, as indicated by D6, in the step S112, it is also possible to additionally perform the update process of setting a value obtained by decrementing the comparison code to the upper limit value similarly to the step S107. It should be noted that as is understood from the above description, either one of D2, D3, D5, and D6 in FIG. 10 is performed in one update process.

In the example shown in FIG. 8, the H level has also been obtained as the second comparison result. Therefore, the process of the step S111, namely D5 in FIG. 10, is performed. Specifically, the control circuit 50 updates (C9) the lower limit value with the value of the comparison code, and increases (C10) the upper limit value as much as the extension code.

According to the method of the present embodiment, it becomes possible to extend the conversion range based on the history of the comparison result. As is understood from the comparison between C2 and C4 in FIG. 8, in the case in which the answer data exists out of the conversion range, the comparison results of H level or the comparison results of L level continue as a result. Therefore, in the present embodiment, the conversion range is extended using the fact that the same comparison result has been output a predetermined number of times as a trigger. According to this configuration, it becomes possible to extend the conversion range without performing any special comparison process, and it is possible to prevent the advantage of the speeding-up from being impaired. For example, according to the method of the present embodiment, the comparison between the D/A conversion result of the upper limit value and the analog input signal VIN, or the comparison between the D/A conversion result of the lower limit value and the analog input signal VIN does not become essential.

The same applies to the subsequent processes, it is sufficient to execute the loop process shown in the step S102 through the step S112 until YES is determined in the step S108. In the case of the example shown in FIG. 8, since the D/A conversion result of the comparison code (C11) used for the third comparison becomes higher than the analog input signal VIN, the L level is determined, and the upper limit value is updated (C12) due to the process of the step S107. Thereafter, the extension of the conversion range is unnecessary, and it is sufficient to keep narrowing the conversion range due to the process of the step S106 or the step S107, and then set the lower limit value (or the upper limit value) as the A/D conversion result data at the moment when (upper limit value)=(lower limit value) is achieved.

It should be noted that as described in the step S104 of FIG. 7, in the case in which the comparison circuit CP outputs the same comparison result a predetermined number of times or more from the first comparison in the successive approximation process, the control circuit 50 performs at least one of the update of increasing the upper limit value and the update of decreasing the lower limit value.

Therefore, in the case in which, for example, the predetermined number of times described above is twice, and the first through third comparison results are L level→H level→H level, although the H level is output twice, there is no need to perform the update of increasing the upper limit value. Similarly, in the case in which the first through third comparison results are H level→L level→L level, there is no need to perform the update of decreasing the lower limit value.

If the L level has already been output at least once, the answer data must be lower than the comparison code on that occasion. Therefore, it is conceivable that the answer data is included in the conversion range in the present setting of the upper limit value. Therefore, even if the determinations of the H level occur thereafter consecutively, the significance for increasing the upper limit value to extend the conversion range is low. The same applies to the case in which the H level has been output at least once, and then the L level is output the predetermined number of times. Taking the above into consideration, in the present embodiment, the fact that "the same comparison result is output a predetermined number of times in a row from the first comparison" is used as a criterion for the conversion range extension. Thus, it is possible to prevent the extension process low in necessity, and therefore, appropriate speeding-up becomes possible.

As described later, it is possible for an erroneous determination to occur in the comparison circuit CP, which leads to the fact that the analog input signal VIN and the D/A conversion result of the comparison code are so close to each other (a "minute signal" described later) that the erroneous determination might occur. Therefore, such a case can be dealt with the redundancy range addition described later or a multiple time determination, and the extension of the conversion range is not required.

Further, in the case in which the upper limit value has reached the upper limit of the full scale of the successive approximation data, the control circuit 50 updates the upper limit value with the upper limit of the full scale, and in the case in which the lower limit value has reached the lower limit of the full scale of the successive approximation data, the control circuit 50 updates the lower limit value with the lower limit of the full scale.

As described above, the upper limit value and the lower limit value increases or decreases as much as the extension code. Therefore, depending on the state of the upper limit value and the lower limit value before the update, and the extension code, there can be the case in which the value of (upper limit value)+(extension code) exceeds the upper limit value of the full scale (becomes equal to or higher than 65536 in the case of 16 bits), or the case in which the value of (lower limit value)-(extension code) falls below the lower limit value of the full scale (becomes lower than 0). In that case, it is low in significance to make the range out of the full scale be included in the conversion range. Further, there is a possibility that the successive approximation data determined by the upper limit value and the lower limit value comes too close to the upper limit value or the lower limit value of the full scale to thereby make the search inefficient, and there is a possibility that the successive approximation data exceeds the upper limit value or fall below the lower limit value of the full scale in an extreme example to make the comparison inappropriate.

In this regard, by keeping the upper limit value and the lower limit value in the upper limit and the lower limit, respectively, an appropriate successive approximation process can be realized. In the case of the example shown in FIG. 3 described above, although the outputs of the H level occur consecutively in the range indicated by B6, the upper limit value has reached the upper limit of the full scale, and therefore does not increase to a higher level.

3.2 Redundancy Range Addition

Then the redundancy range addition process for improving the conversion accuracy will be described. It is conceivable that an appropriate conversion can be executed due to the process described using FIG. 7 through FIG. 10 even in the case in which the change in the analog input signal VIN is large. However, in the actual circuit device 40, it is necessary to take the possibility of occurrence of an error into consideration. Specifically, there is a possibility that despite the fact that the analog input signal VIN is equal to or higher than (lower than) the D/A conversion result of the comparison code, the comparison circuit CP erroneously outputs the L level (H level). In that case, by performing the update of D2 or D3 in FIG. 10, the answer data becomes out of the conversion range, and the appropriate conversion becomes unachievable. According to the processing flow shown in FIG. 7 described above, the chance for extending the conversion range is restricted, and depending on the occurrence timing of the erroneous determination, subsequent recovery is difficult.

Therefore, it is possible for the control circuit 50 to perform the redundancy range addition process of updating the lower limit value with a value between the lower limit value before the update and the successive approximation data in the case in which the comparison circuit CP has output the comparison result that the voltage level of the analog input signal VIN is equal to or higher than the voltage level of the output signal DQ from the D/A conversion circuit DAC, and updating the upper limit value with a value between the upper limit value before the update and the successive approximation data in the case in which the comparison circuit CP has output the comparison result that the voltage level of the analog input signal VIN is lower than the voltage level of the output signal DQ from the D/A conversion circuit DAC.

According to such a configuration, it becomes possible to keep the conversion range broader compared to the update of D2 or D3 in FIG. 10. Specifically, a part of the region to be out of the conversion range in the case in which the lower limit value increases due to the update of D2, or a part of the region to be out of the conversion range in the case in which the upper limit value decreases due to the update of D3 remains within the conversion range. Thus, even in the case in which the erroneous determination has occurred, it is possible to increase the possibility that the answer data is within the conversion range, and the appropriate conversion can be realized.

Figure 11:
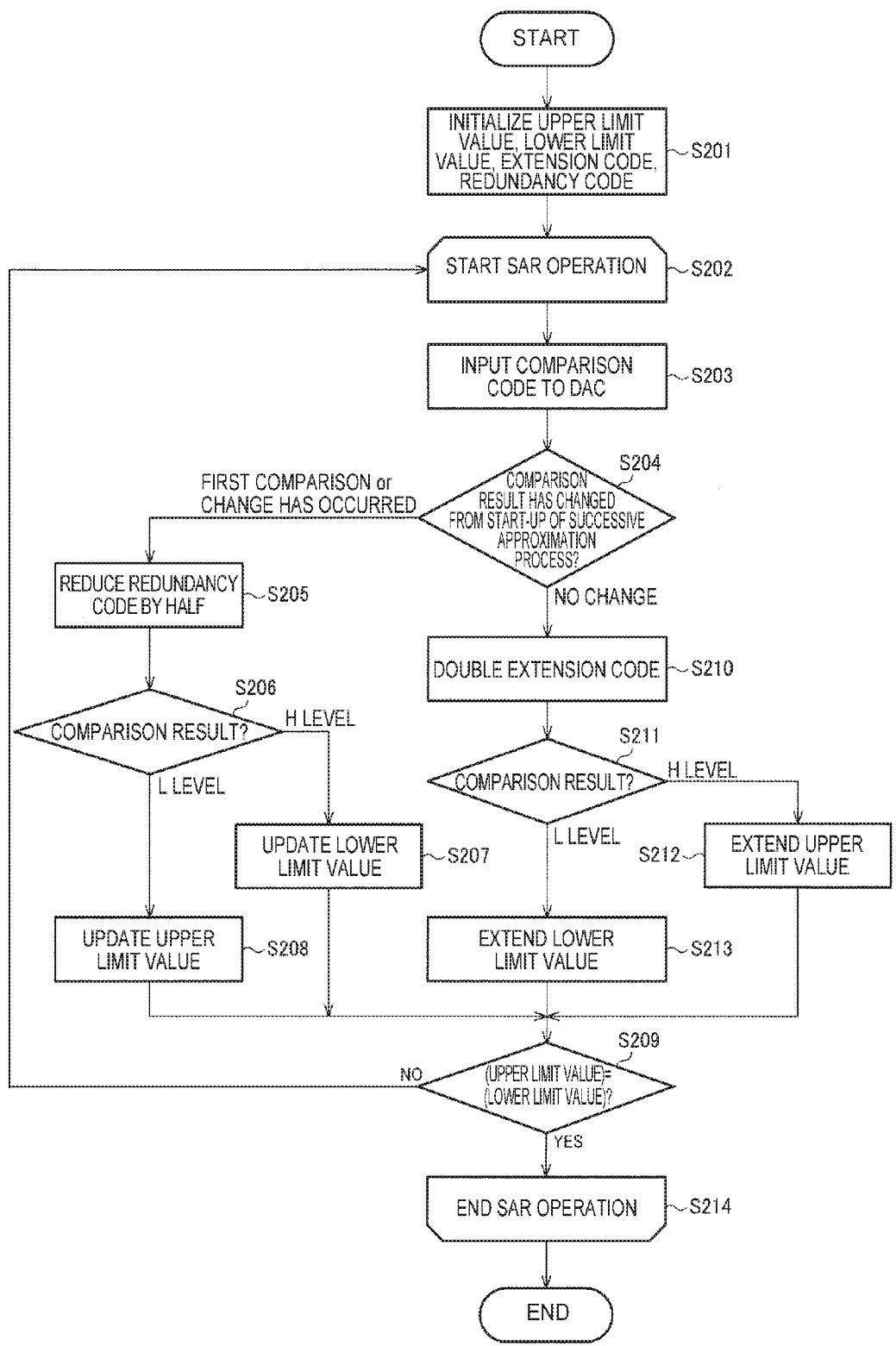
FIG. 11 is a flowchart for explaining a successive approximation process in the case of performing a redundancy range addition process.
Figure 12:
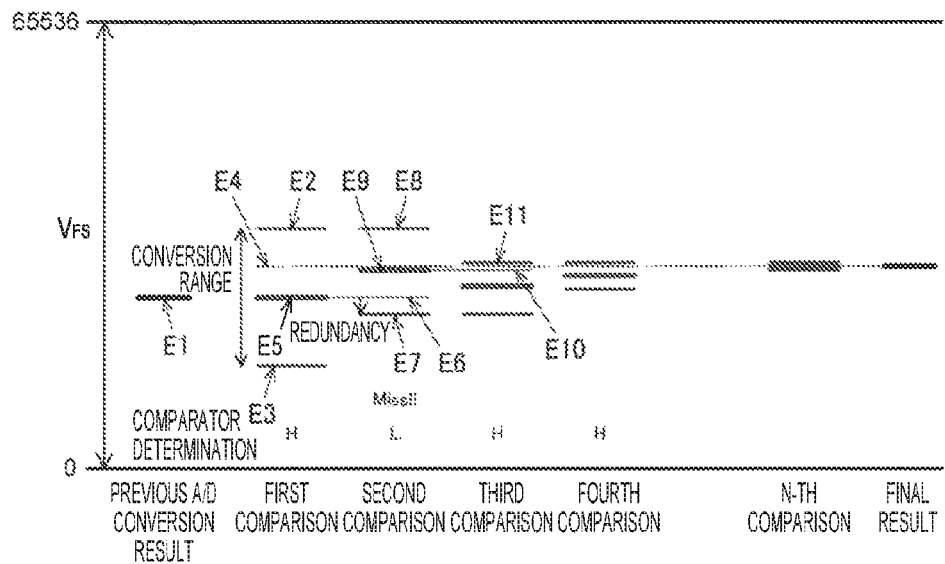
FIG. 12 is a diagram showing an example of updating an upper limit value, a lower limit value, and successive approximation data in the case of performing the redundancy range addition process.

FIG. 11 is a flowchart for explaining a successive approximation process in the case of performing the redundancy range addition process. FIG. 12 is an example of the update of the upper limit value, the lower limit value, and the comparison code. Further, FIG. 13 and FIG. 14 are diagrams for explaining a register operation.

When the successive approximation process is started, the control circuit 50 first performs (step S201) an initialization process of the upper limit value and the lower limit value of the conversion range, the extension code, and a redundancy code. The upper limit value, the lower limit value, and the extension code are substantially the same as in the step S101 in FIG. 7. Further, the redundancy code is information representing the width (width of the increment of the conversion range compared to D2, D3 in FIG. 10) of the redundancy range.

Figure 13:
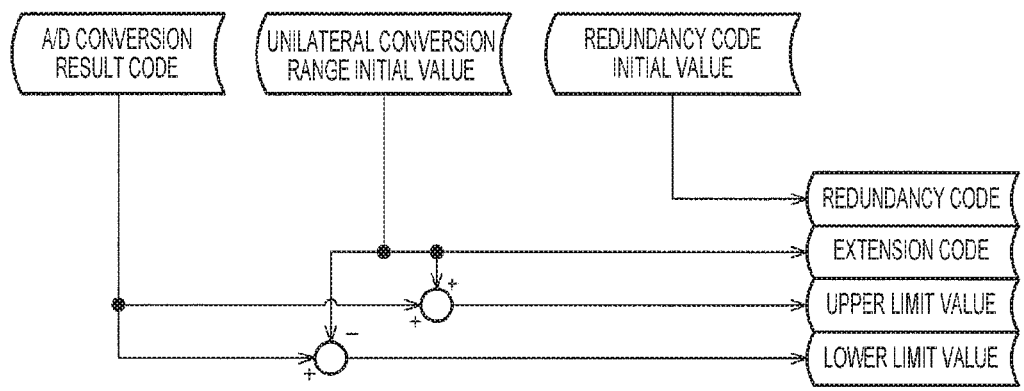
FIG. 13 is an explanatory diagram of the register operation in the case of performing the redundancy range addition process.
Figure 14:
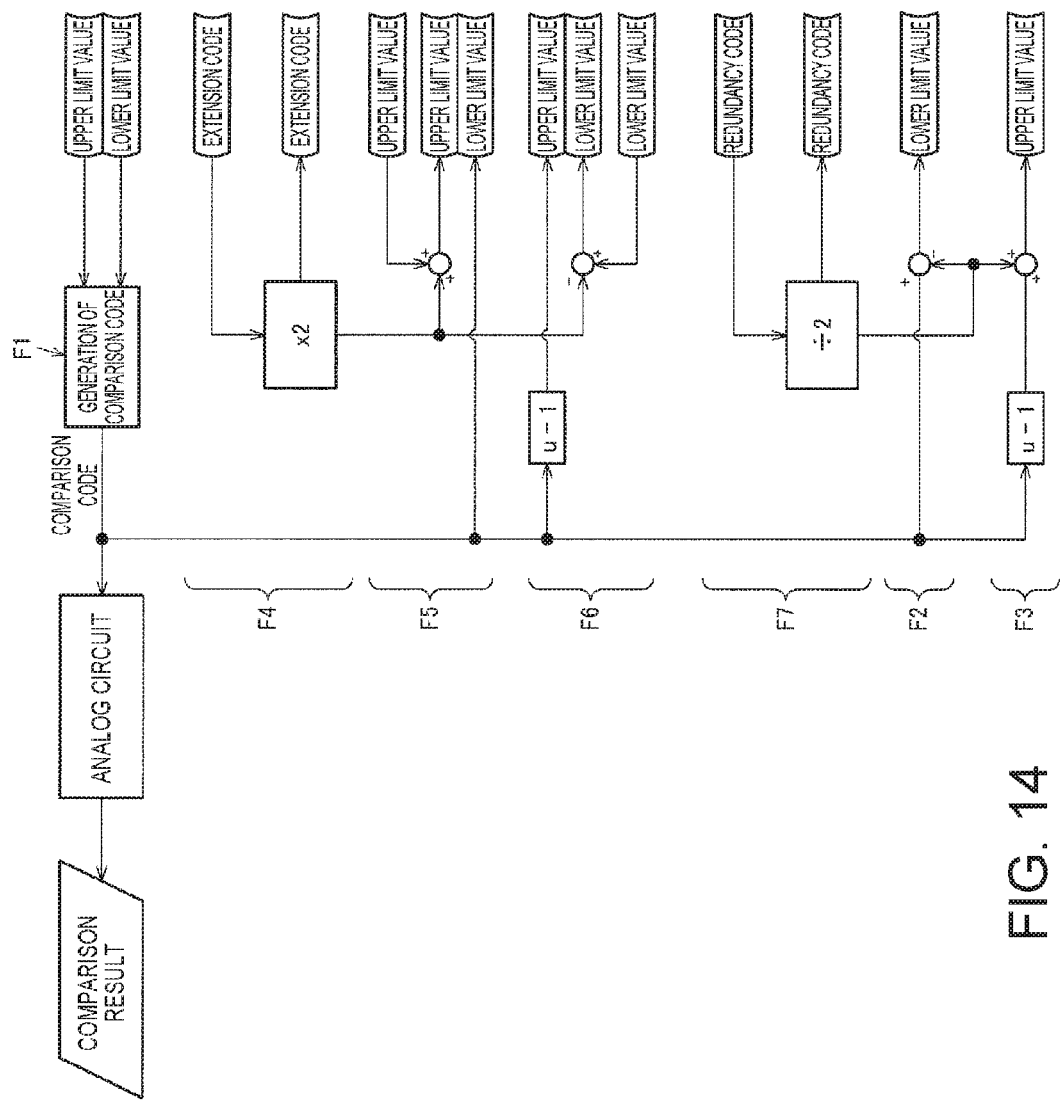
FIG. 14 is an explanatory diagram of the register operation in the case of performing the redundancy range addition process.

FIG. 13 is a diagram for explaining the operations of the upper limit value register, the lower limit register, the extension code register, and a redundancy code register. As shown in FIG. 13, regarding the redundancy code, a certain initial value is set in advance, and in the process of the step S201, the control circuit 50 stores the redundancy code initial value in the redundancy code register as the redundancy code.

The steps S202 through S204, and the steps S209 through S214 shown in FIG. 11 are substantially the same as the steps S102 through S104, and the steps S108 through S113 shown in FIG. 7, and therefore, the detailed description will be omitted. Similarly, F1, F4 through F6 shown in FIG. 14 are substantially the same as D1, D4 through D6 shown in FIG. 10, and therefore, the detailed description will be omitted.

In the case of performing the redundancy range addition process, the control circuit 50 performs the update process of the upper limit value or the lower limit value using the redundancy code. Specifically, in the case of the first comparison or in the case in which a change in the comparison result has occurred in the step S204, the control circuit 50 first performs (step S205) an update process of the redundancy code. Specifically, as indicated by the reference symbol F7 in FIG. 14, it is sufficient to perform a process of reducing the redundancy code by half.

Then, the control circuit 50 determines (step S206) the comparison result from the comparison circuit CP, and then updates (step S207) the lower limit value in the case of the H level, and updates (step S208) the upper limit value in the case of the L level. The register operation in the step S207 corresponds to F2 in FIG. 14, and the register operation in the step S208 corresponds to F3.

As indicated by F2, in the case in which the H level has been determined, the control circuit 50 sets a value of (comparison code)−(redundancy code) as the new lower limit value instead of setting the comparison code itself as the lower limit value. Further, as indicated by F3, in the case in which the L level has been determined, the control circuit 50 sets a value of (comparison code)−1+(redundancy code) as the new upper limit value instead of setting a value of (comparison code)−1 as the upper limit value.

FIG. 12 is an example of the update of the upper limit value, the lower limit value, and the comparison code. The reference symbol E1 corresponds to the A/D conversion result data, and the dotted line indicated by the reference symbol E4 represents the answer data corresponding to the present analog input signal VIN. Due to the process of the step S201 and FIG. 13, the initial value (E2) of the upper limit value and the initial value (E3) of the lower limit value are determined, and due to the process of the step S203 and F1 shown in FIG. 14, the initial value E5 of the comparison code is set.

Since the H level has been output as the first comparison result, the update process of the lower limit value due to the step S207 is performed. On this occasion, in the case of the example of D2 shown in FIG. 10, the new lower limit value becomes equal (E6) to the successive approximation data indicated by E5. However, due to the addition of the redundancy range, the new lower limit value is updated (E7) with a value lower than E6 as much as the redundancy code. According to the configuration described above, it is possible to keep the range no lower than E7 and lower than E6 in the conversion range, and the influence of the erroneous determination can be prevented.

Further, as the new comparison code, a value indicated by the reference symbol E9 is set based on the lower limit value (E7) and the upper limit value (E8=E2). Further, in the example shown in FIG. 12, although (answer data E4)> (comparison code E9) is true, since E9 and E4 are extremely close to each other, an erroneous determination occurs in the second comparison process, and the L level has been output despite the fact that the H level should have normally been output.

In the case of the example of D3 in FIG. 10, the new upper limit value becomes the value (E10) obtained by decrementing the comparison code E9, and the answer data E4 becomes out of the conversion range. However, according to the update indicated by F3, the upper limit value is updated with a value (E11) higher than E10 as much as the redundancy code. Since in FIG. 12, E11>E4 can be set, the answer data becomes within the conversion range, and the influence of the erroneous determination can successfully be prevented. As described above, by performing the redundancy range addition process, it is possible to increase the conversion accuracy.

However, in the case of adding the redundancy range, the width of the conversion range increases (the decrement of the conversion range decreases) compared to the case in which the redundancy range is not added. Therefore, the number of the cycles performed until the process converges to the state in which (upper limit value)=(lower limit value) is true. In particular, if the addition of the redundancy range is continued despite the fact that the conversion range itself has become too narrow, there arises the possibility that the process permanently fails to converge due to the influence of the redundancy range added.

Therefore, it is advisable to make the control circuit 50 skip the redundancy range addition process in the case in which the size of the conversion range set with the upper limit value and the lower limit value is reduced to a level smaller than a predetermined range width. By adopting this process, since the redundancy range is not added in the case in which the conversion range is narrower than the predetermined range width, it becomes possible to make the process appropriately converge to the state in which (upper limit value)=(lower limit value) is true. Further, conversely, in the case in which the conversion range is relatively broad, the addition of the redundancy range is possible, and in such a condition, the influence of the erroneous determination can be prevented. In other words, the redundancy range addition corresponding to the situation becomes possible.

It should be noted that there can be cited a variety of methods for determining whether or not the size of the conversion range has become smaller than a predetermined range width. For example, it is also possible to obtain the upper limit value and the lower limit value from the register, and then set the difference value thereof as the size of the conversion range. Further, the value of the predetermined range width is separately stored in a register in advance, and it is sufficient for the control circuit 50 to perform a comparison process between the difference value described above and the predetermined range width.

Alternatively, in view of the fact that the size of the conversion range decreases due to the update of decreasing the upper limit value or the update of increasing the lower limit value, it is also possible to perform a process taking the number of executions of the process in the step S207 or the step S208 into consideration instead of obtaining the size of the conversion range itself. Specifically, as shown in the step S205 in FIG. 11, a process of reducing the redundancy code by half is performed in the anterior stage of the step S207 or the step S208. By adopting this process, the redundancy code is updated with a smaller value as the conversion range is narrowed, and by performing the update a predetermined number of times, the redundancy code becomes zero. If the redundancy code becomes zero, the process of F2, F3 becomes substantially the same as D2, D3, and thus, the redundancy range addition process is skipped. In other words, due to the process shown in the step S205, whether or not the redundancy range addition is performed can be switched in accordance with the size of the conversion range. It should be noted that it is possible to adopt a variety of practical modifications such as performing the process of the step S205 in a posterior stage of the step S207 or the step S208, or making the update process of the redundancy code different from F7 in FIG. 14.

Further, it is also possible for the control circuit 50 to skip the redundancy range addition process in the case in which the comparison circuit CP has output the same comparison result a predetermined number of times or more in the successive approximation process. The "skip of the redundancy range addition process" here represents that the redundancy range addition process is not performed, and more specifically, represents that the update process of the upper limit value or the lower limit value is performed without adding the redundancy range. For example in the case of the flowchart shown in FIG. 11, in the case in which it has been determined in the step S204 that no change has occurred, the process of the step S212 or the step S213 is performed, and the step S212 can be realized by F5 in FIG. 14, and the step S213 can be realized by F6 in FIG. 14. Further, F5, F6 are substantially the same as D5, D6 in FIG. 10, the lower limit value is updated with the value of the comparison code in F5, and in F6, the upper limit value is updated with the value of (comparison code)−1, and the redundancy code is not used.

As described above, the case of extending the conversion range is the case in which the answer data is suspected to be out of the conversion range. For example, the case in which the H levels are consecutive is the case in which there is a possibility that the answer data is higher than the upper limit value of the conversion range. In that case, the necessity of considering the possibility that the answer data runs off toward the side lower than the lower limit value is low, and the significance of using the redundancy code for the update of the lower limit value is low. Similarly, in the case in which the L levels are consecutive, it is sufficient to consider the case in which the answer data is lower than the lower limit value, and the necessity of considering the possibility that the answer data is higher than the upper limit value is low.

Therefore, by performing the conversion range extension and the redundancy range addition exclusively, it is possible to prevent the conversion range from being excessively enlarged, and it is possible to prevent the advantage of the speeding-up from being impaired. In this case, it is also possible to use a single register in common instead of separately providing the redundancy code register and the extension code register as shown in FIG. 13 and FIG. 14. Further, the update process related to the extension code indicated by F4 through F6 and the update process related to the redundancy code indicated by F2, F3, and F7 are similar in content to each other. Therefore, since the circuits for executing the respective processes also become similar in configuration to each other, it is also possible to use a single circuit for both of the processes instead of providing two circuits respectively.

3.3 Minute Signal Determination

As described above, in the case in which the size of the conversion range has been decreasing, it becomes difficult to add the redundancy range. If the erroneous determination occurs in the case in which the redundancy range is not added, an appropriate conversion cannot be achieved. Further, there is a high possibility that the erroneous determination in the comparison circuit CP occurs in the case in which the difference between the analog input signal VIN and the D/A conversion result of the comparison code is small.

Therefore, it is also possible for the circuit device 40 according to the present embodiment to include a minute signal determination circuit 90 for determining the magnitude of the difference between the voltage level of the analog input signal VIN and the voltage level of the output signal DQ from the D/A conversion circuit DAC. Then, on the ground that the difference has been determined as a minute signal by the minute signal determination circuit 90, a multiple comparison process is performed, and in the case in which the difference has been determined as a non-minute signal by the minute signal determination circuit, the multiple comparison process is skipped.

By adopting this process, in the case in which the possibility of the erroneous determination is high, the comparison process is performed a plurality of times, and a conclusive comparison result can be determined based on the plurality of executions of the comparative process. Therefore, it is possible to improve the accuracy of the comparison process to thereby prevent the erroneous determination from occurring. It should be noted that is the comparison process is performed a plurality of times, the number of the cycles increases accordingly, and the advantage of the speeding-up is impaired. Therefore, in the case in which the redundancy range addition process can deal with the situation, it is desirable to deal with the situation with the redundancy range addition instead of the multiple comparison process.

Therefore, as one example, the control circuit 50 performs the multiple comparison process in the case in which the difference has been determined as the minute signal by the minute signal determination circuit 90 and the redundancy range addition process is not performed, and skips the multiple comparison process in the case in which the difference has been determined as the non-minute signal by the minute signal determination circuit, or in the case in which the redundancy range addition process is performed. By adopting this process, since the number of executions of the multiple comparison process is reduced, and it is possible to prevent the number of the cycles from increasing.

Figure 15:
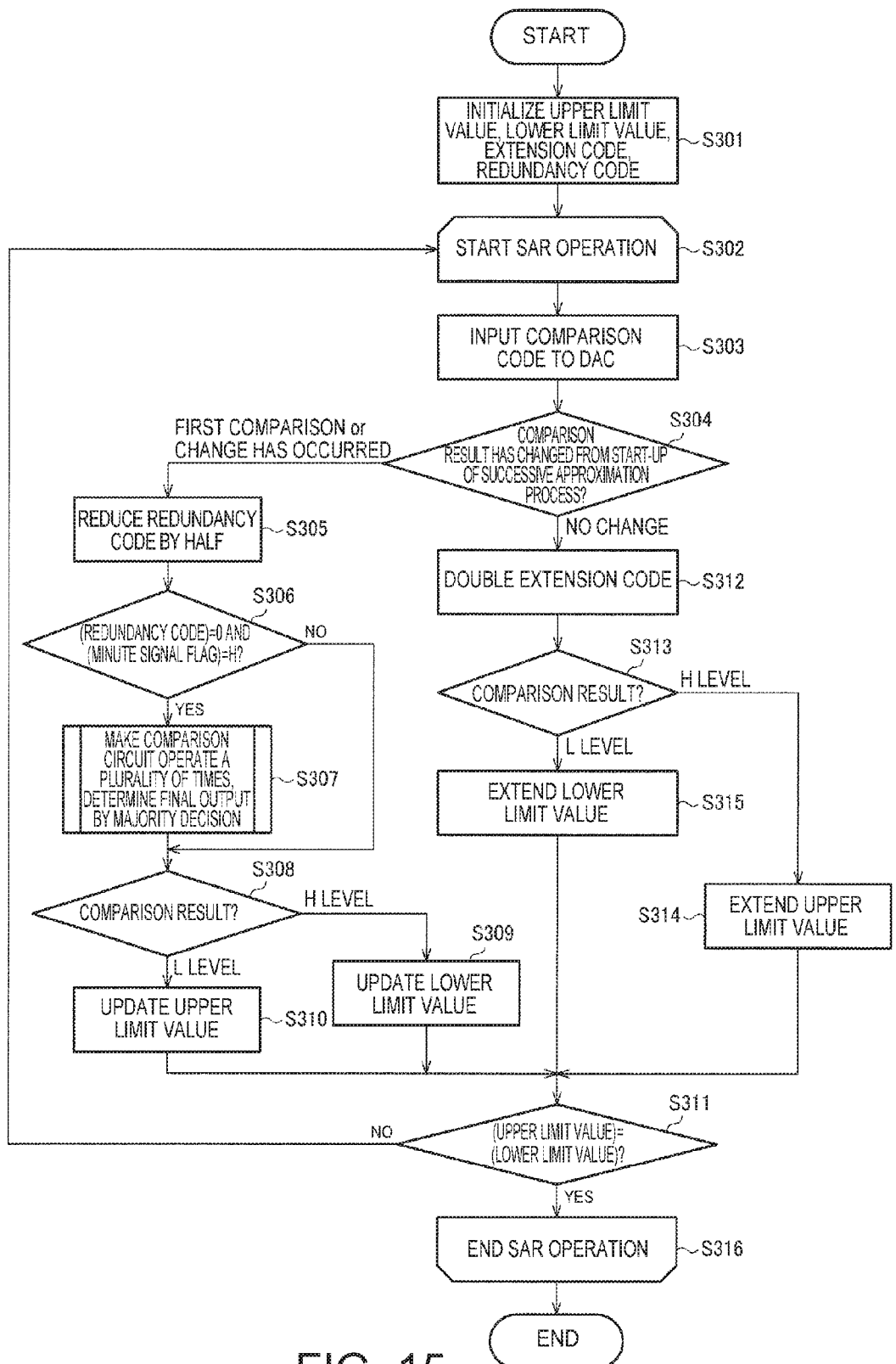
FIG. 15 is a flowchart for explaining a successive approximation process in the case of performing a minute signal determination.

FIG. 15 is a flowchart for explaining the successive approximation process using the output from the minute signal determination circuit 90. The steps in FIG. 15 except the steps S306 and S307 are substantially the same as those in FIG. 12, and therefore the detailed description will be omitted.

After the update of the redundancy code in the step S305, the control circuit 50 determines (step S306) whether or not (redundancy code)=0 is true, and a minute signal flag SFLAG from the minute signal determination circuit 90 is in the high level. It should be noted that the minute signal flag SFLAG denotes a flag representing whether or not the difference between the analog input signal VIN and the output signal DQ from the D/A conversion circuit is smaller than a given threshold value, namely whether or not the difference is the minute signal, using the minute signal determination circuit 90. Here, there is described the example in which SFLAG=H is set in the case in which it has been determined that the difference is the minute signal, but a variety of practical modifications can be adopted in this regard.

In the case of NO in the step S306, the control circuit 50 makes the transition to the process of the steps S308 through S310. The case of NO in the step S306 corresponds to the case in which the redundancy code is not zero, and the redundancy range addition process is performed, or the case in which (redundancy code)=0 is true but the SFLAG=L is true, and therefore the possibility of the occurrence of the erroneous determination is low. In either of the cases, the problem caused by updating the upper limit value or the lower limit value based on the single comparison result is small.

In contrast, the case of YES in the step S306 corresponds to the case in which the redundancy range addition process cannot be performed despite that fact that the possibility of the occurrence of the erroneous determination is high. Therefore, in this case, the control circuit 50 makes the comparison circuit CP operate a plurality of times to obtain a plurality of comparison results, and then determines (step S307) the conclusive comparison result based on the plurality of comparison results. As an example, it is sufficient to perform majority decision with the plurality of comparison results, and determine the H level in the case in which (number of times of H level)>(number of times of L level) is true, and determine the L level in the case in which (number of times of L level)>(number of times of H level) is true.

In the case in which the process in the step S307 has been performed, the determination is performed in the step S308 using the result of the majority decision, and then the update process in the step S309 or the step S310 is performed.

It should be noted that as described above, the case in which the redundancy range addition process is not performed corresponds to the case in which the conversion range is smaller than the predetermined range width. Therefore, in the case in which the conversion range set with the upper limit value and the lower limit value becomes smaller than the range width described above, the control circuit 50 are required to perform the multiple comparison process of making the comparison circuit CP perform the comparison process between the analog input signal VIN and the output signal DQ from the D/A conversion circuit DAC a plurality of times.

Figure 16:
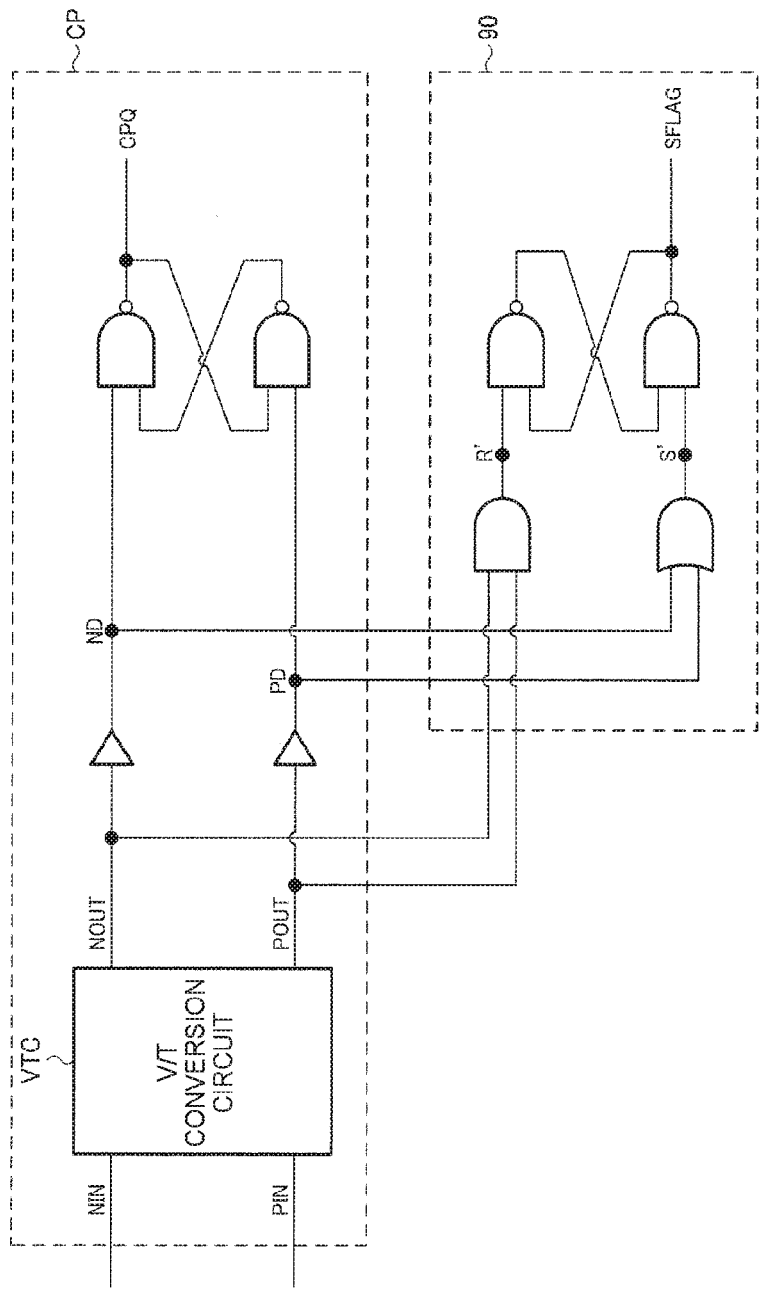
FIG. 16 is a diagram showing a configuration example of a comparison circuit and a minute signal determination circuit.

FIG. 16 shows a configuration example of the comparison circuit CP and the minute signal determination circuit 90 of the present embodiment. The comparison circuit CP includes a V/T conversion circuit VTC for outputting output signals POUT, NOUT based on input signals PIN, NIN. The output signals POUT, NOUT of the V/T conversion circuit VTC are step signals in which rising from a low level to a high level occurs at given timing as described later using FIG. 17 and FIG. 18, and the rising timing (a delay time with respect to given reference timing) is determined by the level of the input signals (input voltages) PIN, NIN. Here, the example in which the higher the input signal is, the shorter the delay time is (the earlier the rising occurs) will be described.

In the case of PIN>NIN, POUT rises first, and then NOUT rises. In the case of NIN>PIN, NOUT rises first, and then POUT rises. Therefore, in the comparison circuit CP, it is sufficient to output a signal representing which one of POUT and NOUT rises earlier as the comparison result signal CPQ.

As an example, as shown in FIG. 16, the signal CPQ is output using two NAND circuits. The reference symbols ND, PD denote the signals on the terminals shown in FIG. 16. As shown in FIG. 16, ND denotes a signal obtained by delaying NOUT a predetermined delay time $\tau$ with the delay element, and PD denotes a signal obtained by delaying POUT the predetermined delay time $\tau$ with the delay element.

The operation of the configuration of outputting CPQ is equivalent to the operation of an RS flip-flop. Specifically, in the case of (PD, ND)=(1, 0), CPQ=1 is true, and in the case of (PD, ND)=(0, 1), CPQ=0 is true. Further, in the case of (PD, ND)=(1, 1), CPQ keeps the previous state.

Therefore, in the case in which PD rises earlier than ND, CPQ=1 is true, and in the case in which ND rises earlier than PD, CPQ=0 is true. In other words, CPQ is a signal, which changes to the high level or the low level in accordance with which one of PD and ND rises earlier, and the high level of CPQ represents PIN>NIN, and the low level of CPQ represents NIN>PIN.

Further, the minute signal determination circuit 90 includes an AND circuit, an OR circuit, and two NAND circuits. To the AND circuit, NOUT and POUT are input. To the OR circuit, PD and ND are input.

In the case of defining the output of the AND circuit as R', R' is a step signal, which is switched to the high level at the timing corresponding to the timing when rising of POUT and rising of NOUT are completed. In the case of defining the output of the OR circuit as S', S' is a step signal, which is switched to the high level at the timing corresponding to the timing when either one of PD and ND rises, namely when the delay time τ due to the delay element has elapsed after either one of POUT and NOUT rises.

The operation of the two NAND circuits for outputting SFLAG is also equivalent to the operation of an RS flip-flop. Specifically, in the case of (S', R')=(1, 0), SFLAG=0 is true, and in the case of (S', R')=(0, 1), SFLAG=1 is true. Further, in the case of (S', R')=(1, 1), SFLAG keeps the previous state.

The case of (S', R')=(1, 0) corresponds to the case in which at the timing when the delay time τ has elapsed after one of POUT and NOUT rises, rising of the other of the signals POUT, NOUT does not occur. This corresponds to the case in which the time difference in rising between POUT and NOUT is longer than τ, which means that the voltage difference between PIN and NIN is large. Therefore, SFLAG=0 represents the non-minute signal as a result.

The case of (S', R')=(0, 1) corresponds to the case in which before the timing when the delay time τ has elapsed after one of POUT and NOUT rises, rising of the other of the signals POUT, NOUT has also occurred. This corresponds to the case in which the time difference in rising between POUT and NOUT is smaller than τ, which means that the voltage difference between PIN and NIN is small. Therefore, SFLAG=1 represents the minute signal as a result.

Figure 17:
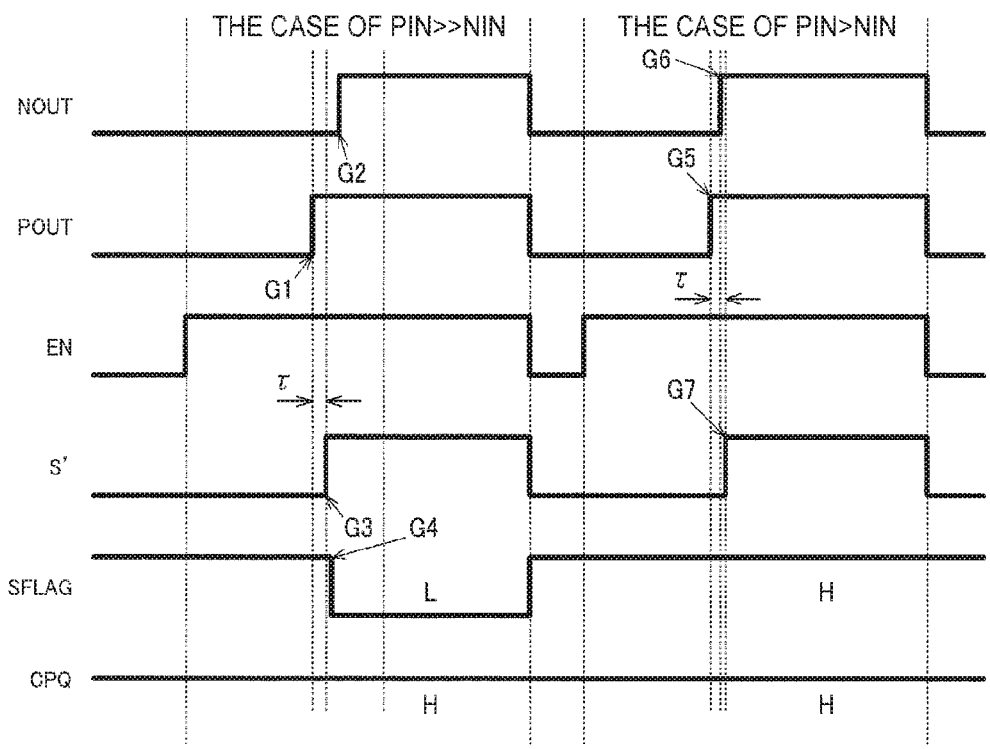
FIG. 17 is a waveform chart for explaining operations of the comparison circuit and the minute signal determination circuit.

FIG. 17 is a waveform chart showing the signals in the case of PIN>NIN. In the case in which PIN is sufficiently higher than NIN, POUT rises earlier (G1), and then, after the time longer than the delay time τ has elapsed, NOUT rises (G2). In this case, S' rises at the timing (G3) when the delay time τ has elapsed from G1, and R' rises at the timing corresponding to G2. As a result, SFLAG changes to the low level at the timing G4 corresponding to G3, and it is possible for the control circuit 50 to determine that the difference is the non-minute signal.

In contrast, in the case in which the difference between PIN and NIN is small, POUT rises earlier (G5), and then, after the time shorter than the delay time τ has elapsed, NOUT rises (G6). In this case, S' rises at the timing (G7) when the delay time τ has elapsed from G5, and R' rises at the timing corresponding to G6. As a result, SFLAG is kept at the high level, and it is possible for the control circuit 50 to determine that the difference is the minute signal. Further, in either of the cases, since POUT rises earlier, and then NOUT rises later, CPQ is kept at the high level.

Figure 18:
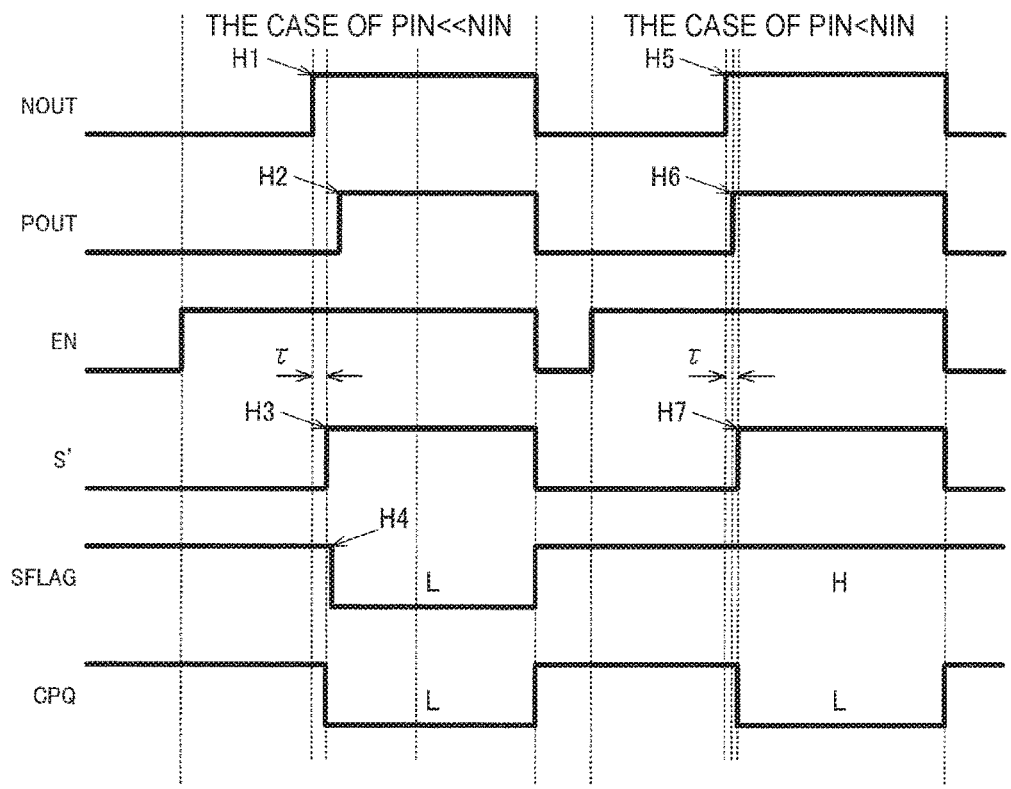
FIG. 18 is a waveform chart for explaining operations of the comparison circuit and the minute signal determination circuit.

FIG. 18 is a waveform chart showing the signals in the case of NIN>PIN. In the case in which NIN is sufficiently higher than PIN, NOUT rises earlier (H1), and then, after the time longer than the delay time τ has elapsed, POUT rises (H2). In this case, S' rises at the timing (H3) when the delay time τ has elapsed from H1, and R' rises at the timing corresponding to H2. As a result, SFLAG changes to the low level at the timing H4 corresponding to H3, and it is possible for the control circuit 50 to determine that the difference is the non-minute signal.

In contrast, in the case in which the difference between PIN and NIN is small, NOUT rises earlier (H5), and then, after the time shorter than the delay time τ has elapsed, POUT rises (H6). In this case, S' rises at the timing (H7) when the delay time τ has elapsed from H5, and R' rises at the timing corresponding to H6. As a result, SFLAG is kept at the high level, and it is possible for the control circuit 50 to determine that the difference is the minute signal. Further, in either of the cases, since NOUT rises earlier, and then POUT rises later, CPQ changes to the low level at the timing corresponding to when the delay time τ has elapsed from the rising timing H1 of NOUT.

It should be noted that the configuration of the minute signal determination circuit 90 is not limited to FIG. 16. For example, the comparison circuit CP can be formed of a plurality of comparators. Specifically, there is used a comparison circuit CP including a second comparator for comparing PIN+OFFSET and NIN with each other, and a third comparator for comparing PIN and NIN+OFFSET with each other in addition to a first comparator for comparing PIN and NIN with each other. In the case in which the comparison results of all of the comparators are the same, since it results that the difference between PIN and NIN is equal to or larger than the offset voltage, it is determined that the difference is the non-minute signal. In contrast, in the case in which the comparison results of all of the comparators are not the same, since it results that the difference in voltage between PIN and NIN is smaller than the offset voltage, it is determined that the difference is the minute signal. Besides the above, a variety of practical modifications can be made in the configuration of the minute signal determination circuit 90.

3.4 Modified Examples

Hereinafter, some modified examples will be described.

It is also possible for the circuit device 40 according to the present embodiment to process the plurality of input signals in a time-sharing manner. In the case of, for example, applying the circuit device 40 to a physical quantity detection device 300 described later using FIG. 19, there is a possibility that a plurality of signals is output from a physical quantity transducer 310. In the case in which, for example, the physical quantity transducer 310 is a three-axis gyro sensor element, a signal representing an angular velocity in an x axis, a signal representing an angular velocity in a y axis, and a signal representing an angular velocity in a z axis are input. In the circuit device 40, the three input signals are processed in a time-sharing manner.

In that case, the "previous A/D conversion result data" described above is controversial. For example, there is considered the case in which the A/D conversion of the x-axis signal XIN is performed, and then the A/D conversion of the y-axis signal YIN is performed. On this occasion, it is unreasonable to set the initial value of the conversion range for obtaining the A/D conversion result data of YIN based on the A/D conversion result of XIN. The reason that the previous A/D conversion result data is used is that it is assumed that the A/D conversion result data does not significantly change in the signals of the same kind, and in the case of targeting signals different in kind from each other, such assumption cannot be done.

Therefore, it is advisable to use the "previous A/D conversion result data with respect to the input signal of the same kind" as the "previous A/D conversion result data" in the present embodiment. Specifically, the corresponding number of registers for holding the A/D conversion result data to the number of data are prepared in advance, and when reading the previous A/D conversion result data, the corresponding register is set as the reading target. In the case of the example described above, it is sufficient to prepare a first register for holding the A/D conversion result of XIN, a second register for holding the A/D conversion result of YIN, and a third register for holding the A/D conversion result of ZIN, and read the "previous A/D conversion result data" from the first (second, third) register in the case in which XIN (YIN, AIN) has been input.

Further, in the example described above using FIG. 15, the redundancy range addition process is performed in the case in which the redundancy code is not equal to 0, and the minute signal flag SFLAG has nothing to do with whether or not the redundancy range addition process is performed. However, in the case of (minute signal flag SFLAG)=L, since the possibility of the erroneous determination in the comparison circuit CP is low, the redundancy range addition process is not required to be performed.

Therefore, it is possible for the control circuit 50 to perform the redundancy range addition process or the multiple comparison process in the case in which it has been determined by the minute signal determination circuit 90 that the difference is the minute signal, and to skip the redundancy range addition process and the multiple comparison process in the case in which it has been determined by the minute signal determination circuit that the difference is the non-minute signal. The skip of the redundancy range addition process denotes the update process of the upper limit value or the lower limit value without adding the redundancy range. Further, the skip of the multiple comparison process denotes the fact that the comparison process is not performed a plurality of times when obtaining the comparison process result between the given input signal and the D/A conversion result of the successive approximation data, and specifically corresponds to a process of obtaining the comparison process result between the given input signal and the D/A conversion result of the successive approximation data by a single comparison process. The skip of the multiple comparison process corresponds the fact that the process of the step S307 is omitted (the transition from the step S306 directly to the step S308 is made) in the case of the example shown in FIG. 15.

By adopting such a process, since the redundancy range addition process can be skipped in the case of the non-minute signal irrespective of the value of the redundancy code, it becomes possible to prevent the number of the cycles from increasing.

4. Physical Quantity Detection Device, Electronic Apparatus, and Vehicle

Further, the method according to the present embodiment can be applied to a variety of devices including the circuit device 40 described above. For example, the method according to the present embodiment can be applied to a physical quantity detection device including a physical quantity transducer, and a circuit device for performing the A/D conversion for detecting the physical quantity based on the detection signal from the physical quantity transducer. Further, the method according to the present embodiment can also be applied to an electronic apparatus and a vehicle including the circuit device 40.

Figure 19:
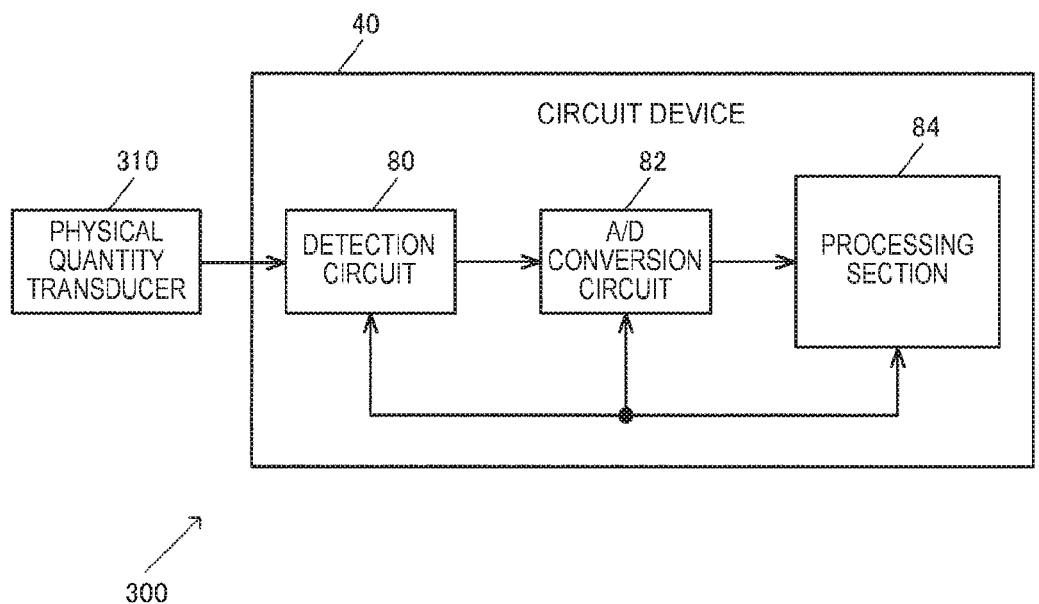
FIG. 19 is a diagram showing a configuration example of a physical quantity detection device including the circuit device according to the embodiment.

FIG. 19 shows a configuration example of a physical quantity detection device 300 according to the present embodiment. The physical quantity detection device 300 includes a physical quantity transducer 310, and the circuit device 40 (IC) according to the present embodiment. The circuit device 40 according to the present embodiment includes an A/D conversion circuit 82 for performing at least the successive approximation type A/D conversion, and the A/D conversion circuit 82 performs the A/D conversion of the signal based on the output signal of the physical quantity transducer 310. It should be noted that the circuit device 40 (the A/D conversion circuit 82) can also be a circuit for performing the A/D conversion of a signal different from the signal based on the output signal of the physical quantity transducer 310. The physical quantity transducer 310 and the circuit device 40 are mounted in a package of, for example, the physical quantity detection device 300. It should be noted that the physical quantity detection device 300 according to the present embodiment is not limited to the configuration shown in FIG. 19, but there can be adopted various practical modifications such as elimination of some of the constituents or addition of other constituents.

The physical quantity transducer 310 is an element (a sensor) for detecting the physical quantity such as an angular velocity, and the acceleration. The physical quantity transducer 310 is, for example, an angular velocity sensor (a gyro sensor), and detects the angular velocity around one or more axes. The angular velocity sensor can be a piezoelectric type vibratory gyroscope, or can also be a capacitance detection type vibratory gyroscope. As the piezoelectric type gyroscope, for example, a double T type vibrator element can be obtained. Alternatively, the physical quantity transducer 310 is, for example, an acceleration sensor, and detects the acceleration in one or more axial directions. It should be noted that the physical quantity transducer 310 can also be a transducer for detecting a physical quantity (e.g., a velocity, a moving distance, angular acceleration, and pressure) other than the angular velocity and the acceleration. Alternatively, the physical quantity transducer 310 can also be a vibrator in an oscillator.

The circuit device 40 includes a detection circuit 80, an A/D conversion circuit 82, and a processing section 84. The detection circuit 80 detects a physical quantity signal corresponding to the physical quantity such as the angular velocity or the acceleration based on the detection signal from the physical quantity transducer 310. Taking the angular velocity sensor as an example, the detection circuit 80 can include an amplification circuit (a charge/voltage conversion circuit) for amplifying the detection signal from the physical quantity transducer 310, a synchronous detection circuit, and so on. In this case, the circuit device 40 can include a drive circuit for driving the physical quantity transducer 310 (a vibrator). The A/D conversion circuit 82 performs the A/D conversion of the analog voltage (the voltage of a desired signal) having been detected by the detection circuit 80. As an A/D conversion circuit 82, there can be used a circuit having the configuration described with reference to, for example, FIG. 1. The processing section 84 performs a variety of processes based on the detection data on which the A/D conversion has been performed by the A/D conversion circuit 82. The processing section 84 performs, for example, a variety of correction processes, a filter process (a digital filter process), and so on. It should be noted that the processing section 84 can also act as the control circuit 50 shown in FIG. 1.

Figure 20:
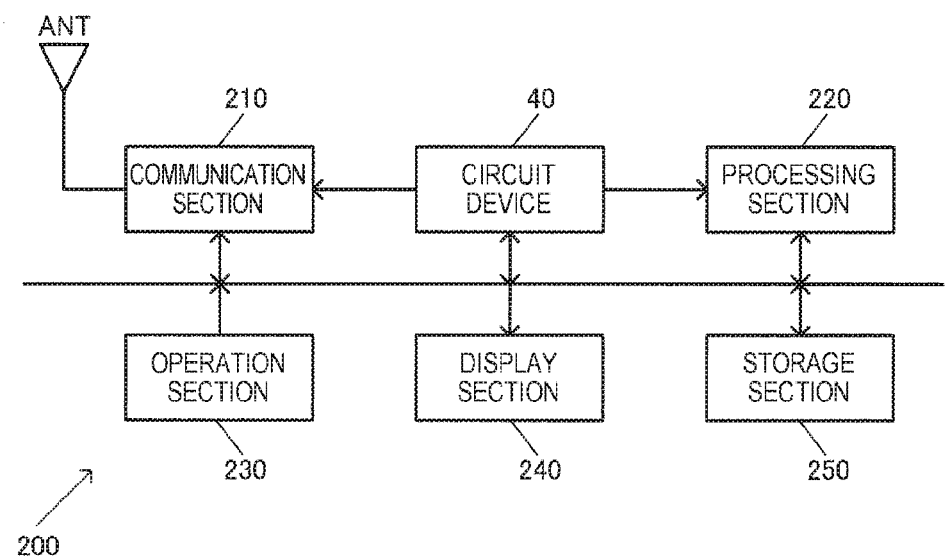
FIG. 20 is a diagram showing an example of an electronic apparatus including the circuit device according to the embodiment.

FIG. 20 shows a configuration example of an electronic apparatus 200 according to the present embodiment. The electronic apparatus 200 includes the circuit device 40 according to the present embodiment, a processing section 220, and a storage section 250. Further, the electronic apparatus 200 can include an antenna ANT, a communication section 210, an operation section 230, and a display section 240. It should be noted that the electronic apparatus 200 according to the present embodiment is not limited to the configuration shown in FIG. 20, but there can be adopted a variety of practical modifications such as elimination of some of the constituents or addition of other constituents.

As the electronic apparatus 200 according to the present embodiment, there can be assumed a variety of apparatuses such as a digital camera (a digital still camera, a video camera), a biological information detection device (e.g., a pulse meter, an activity meter, a pedometer, and a health watch), a head mounted display device, a robot, a GPS built-in watch, a car navigation system, a game machine, a variety of types of wearable equipment, a portable information terminal (e.g., a smartphone, a cellular phone, a portable video game player, and a tablet PC), a content providing terminal to deliver contents, video equipment, audio equipment, or network related equipment (e.g., a base station, and a router). In, for example, a digital camera, by using the circuit device according to the present embodiment, it is possible to realize the image stabilization and so on using the gyro sensor and the acceleration sensor. Further, in the biological information detection device, by using the circuit device according to the present embodiment, it is possible to realize the body motion detection of the user and the detection of an exercise condition using the gyro sensor and the acceleration sensor. In the robot, it is possible to use the circuit device according to the present embodiment in movable sections (arms, joints) and the body part. As the robot, it is possible to assume both of a vehicle (running/walking robot) and an electronic apparatus (non-running/non-walking robot). In the case of the running/walking robot, the circuit device according to the present embodiment can be used for, for example, autonomous running. In the network related equipment, the circuit device according to the present embodiment can be used as a device for measuring, for example, time (e.g., absolute time) or timing.

In FIG. 20, the communication section 210 (a wireless circuit) performs a process of receiving data from the outside via the antenna ANT and transmitting data to the outside. The processing section 220 (a processor) realized by a CPU, an MPU, or the like performs a variety of types of arithmetic processing, control processing of the electronic apparatus 200, and so on based on the information stored in the storage section 250 (memory). The operation section 230 is for allowing the user to perform an input operation, and can be realized by operation buttons, a touch panel display, and so on. The display section 240 is for displaying a variety of types of information, and can be realized by a display using a liquid crystal, an organic EL, and so on. The storage 250 is for storing a variety of types of information, and the function thereof can be realized by a semiconductor memory such as a RAM or a ROM, a hard disk drive (HDD), or the like.

Further, the circuit device according to the present embodiment can be incorporated in a variety of vehicles such as a car, an airplane, a motorbike, a bicycle, a ship, and a boat. The vehicle is equipment or a device provided with a drive mechanism such as an engine or an electric motor, a steering mechanism such as a steering wheel or a helm, and a variety of electronic apparatuses, and moving on the ground, in the air, or on the sea.

Figure 21:
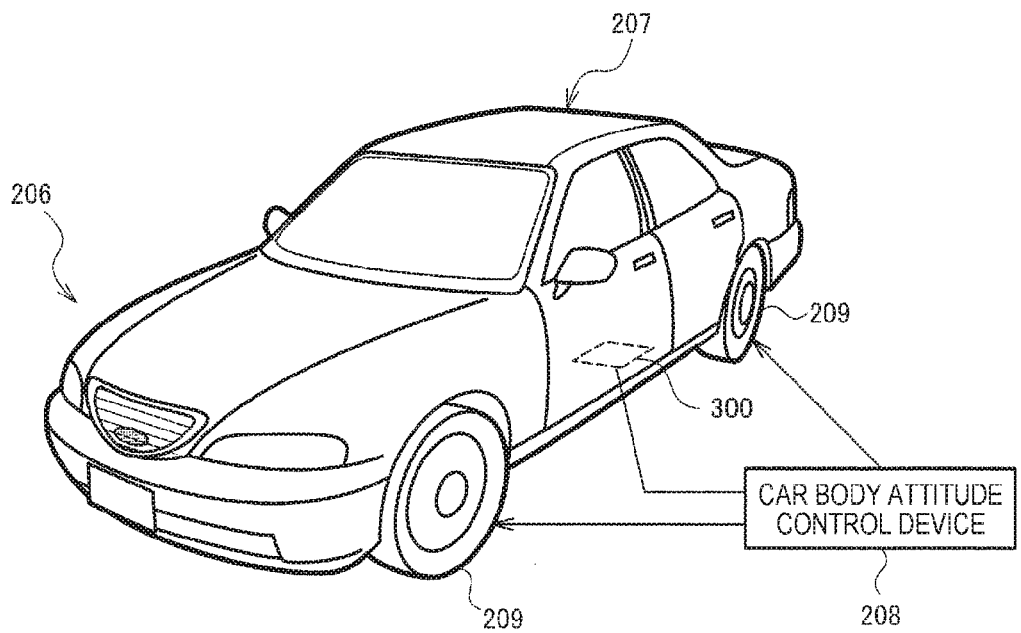
FIG. 21 is a diagram showing an example of a vehicle including the circuit device according to the embodiment.

FIG. 21 schematically shows a car 206 as a specific example of the vehicle. The car 206 incorporates the physical quantity detection device 300 including the physical quantity transducers and the circuit device. The physical quantity detection device 300 (e.g., a gyro sensor and a composite sensor for detecting the angular velocity and the acceleration) is capable of detecting the attitude of a car body 207. A detection signal of the physical quantity detection device 300 is supplied to a car body attitude control device 208. The car body attitude control device 208 is capable of, for example, controlling the stiffness of the suspension, and controlling the brake of each of the wheels 209 in accordance with the attitude of the car body 207. Besides the above, such attitude control as described above can be used for a variety of vehicles such as a two-legged robot, an airplane, and a helicopter. In realizing the attitude control, the physical quantity detection device 300 (the circuit device) is to be incorporated in the vehicle.

Although the embodiments to which the invention is applied, and the modified examples of the embodiments are hereinabove described, the invention is not limited to each of the embodiments and the modified examples of the embodiments, but can be implemented with the constituents modified within the scope or the spirit of the invention in the practical phase. Further, by arbitrarily combining the plurality of constituents disclosed in each of the embodiments and the modified examples described above, a variety of aspects of the invention can be constituted. For example, it is also possible to remove some constituents out of all of the constituents described in each of the embodiments and the modified examples. Further, it is also possible to arbitrarily combine the constituents described in the embodiments and the modified examples different from each other. Further, a term described at least once with a different term having a broader sense or the same meaning in the specification or the accompanying drawings can be replaced with the different term in any part of the specification or the accompanying drawings. As described above, a variety of modifications and applications can be made within the scope or the spirit of the invention.

The entire disclosure of Japanese Patent Application No. 2016-133925, filed Jul. 6, 2016 is expressly incorporated by reference herein.

What is claimed is:

1. A circuit device adapted to perform A/D conversion on an analog input signal, comprising:
   a control circuit having a successive approximation register adapted to hold successive approximation data;
   a D/A conversion circuit adapted to perform D/A conversion on output data from the successive approximation register; and
   a comparison circuit adapted to perform a comparison process between the analog input signal and an output signal from the D/A conversion circuit,
   wherein the control circuit
      includes an upper limit value register adapted to hold an upper limit value of a conversion range of A/D conversion result data obtained by the A/D conversion of the analog input signal, and a lower limit value register adapted to hold a lower limit value of the conversion range, and
      performs at least one of an update of increasing the upper limit value and an update of decreasing the lower limit value in a case in which the comparison circuit has output a same comparison result a predetermined number of times or more in a successive approximation process.

2. The circuit device according to claim 1, wherein
in a case in which the comparison circuit has output a same comparison result the predetermined number of times or more from a first comparison in the successive approximation process, the control circuit performs at least one of the update of increasing the upper limit value and the update of decreasing the lower limit value.

3. The circuit device according to claim 1, wherein
the control circuit
performs an update of increasing the upper limit value in a case in which a comparison result that a voltage level of the analog input signal is one of equal to or higher than a voltage level of the output signal from the D/A conversion circuit has been output by the comparison circuit the predetermined number of times or more, and
performs an update of decreasing the lower limit value in a case in which a comparison result that the voltage level of the analog input signal is lower than the voltage level of the output signal from the D/A conversion circuit has been output by the comparison circuit the predetermined number of times or more.

4. The circuit device according to claim 1, wherein
the control circuit
updates the upper limit value with an upper limit of a full scale of the successive approximation data in a case in which the upper limit value has reached the upper limit of the full scale, and
updates the lower limit value with a lower limit of the full scale of the successive approximation data in a case in which the lower limit value has reached the lower limit of the full scale.

5. The circuit device according to claim 1, wherein
the control circuit performs a redundancy range addition process of
updating the lower limit value with a value between the lower limit value before the update and the successive approximation data in a case in which a comparison result that a voltage level of the analog input signal is one of equal to or higher than a voltage level of the output signal from the D/A conversion circuit has been output by the comparison circuit, and
updating the upper limit value with a value between the upper limit value before the update and the successive approximation data in a case in which a comparison result that the voltage level of the analog input signal is lower than the voltage level of the output signal from the D/A conversion circuit has been output by the comparison circuit.

6. The circuit device according to claim 5, wherein
the control circuit skips the redundancy range addition process in a case in which a same comparison result has been output by the comparison circuit the predetermined number of times or more in the successive approximation process.

7. The circuit device according to claim 5, wherein
the control circuit skips the redundancy range addition process in a case in which a size of the conversion range set with the upper limit value and the lower limit value is reduced to a level smaller than a predetermined range width.

8. The circuit device according to claim 7, wherein
the control circuit performs a multiple comparison process of making the comparison circuit perform the comparison process between the analog input signal and the output signal from the D/A conversion circuit a plurality of times in a case in which the conversion range set with the upper limit value and the lower limit value is reduced to a level smaller than the range width.

9. The circuit device according to claim 8, further comprising:
a minute signal determination circuit adapted to determine magnitude of a difference between a voltage level of the analog input signal and a voltage level of the output signal from the D/A conversion circuit,
wherein the control circuit
performs one of the redundancy range addition process and the multiple comparison process in a case in which it has been determined by the minute signal determination circuit that the difference is a minute signal, and
skips the redundancy range addition process and the multiple comparison process in a case in which it has been determined by the minute signal determination circuit that the difference is a non-minute signal.

10. The circuit device according to claim 1, wherein
the conversion range at start-up of the successive approximation process is a predetermined range including previous A/D conversion result data, and
the control circuit sets an upper limit value of the predetermined range as a value of the upper limit value register, and sets a lower limit value of the predetermined range as a value of the lower limit value register.

11. The circuit device according to claim 1, wherein
the control circuit
performs an update of increasing the lower limit value in a case in which a comparison result that a voltage level of the analog input signal is one of equal to or higher than a voltage level of the output signal from the D/A conversion circuit has been output by the comparison circuit, and
performs an update of decreasing the upper limit value in a case in which a comparison result that the voltage level of the analog input signal is lower than the voltage level of the output signal from the D/A conversion circuit has been output by the comparison circuit.

12. The circuit device according to claim 1, wherein
the control circuit updates the successive approximation data with a value corresponding to an average value of the updated upper limit value and the updated lower limit value after the update.

13. A physical quantity detection device comprising:
a physical quantity transducer; and
the circuit device according to claim 1 adapted to perform A/D conversion to detect a physical quantity based on a detection signal from the physical quantity transducer.

14. A physical quantity detection device comprising:
a physical quantity transducer; and
the circuit device according to claim 2 adapted to perform A/D conversion to detect a physical quantity based on a detection signal from the physical quantity transducer.

15. A physical quantity detection device comprising:
a physical quantity transducer; and
the circuit device according to claim 3 adapted to perform A/D conversion to detect a physical quantity based on a detection signal from the physical quantity transducer.

16. An electronic apparatus comprising:
the circuit device according to claim 1.

17. An electronic apparatus comprising:
the circuit device according to claim 2.

18. An electronic apparatus comprising:
the circuit device according to claim 3.
19. A vehicle comprising:
the circuit device according to claim 1.
20. A vehicle comprising:
the circuit device according to claim 2.

* * * * *